US006198417B1

(12) United States Patent
Paul

(10) Patent No.: US 6,198,417 B1
(45) Date of Patent: Mar. 6, 2001

(54) PIPELINED OVERSAMPLING A/D CONVERTER

(75) Inventor: Susanne A. Paul, Burlington, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/240,040

(22) Filed: Jan. 29, 1999

Related U.S. Application Data

(60) Provisional application No. 60/073,040, filed on Jan. 29, 1998.

(51) Int. Cl.[7] ....................................................... H03M 3/00

(52) U.S. Cl. ............................................. 341/143; 341/126

(58) Field of Search ..................................... 341/143, 142, 341/156, 141, 155, 144, 110, 126

(56) References Cited

U.S. PATENT DOCUMENTS

| 4,746,899 | | 5/1988 | Swanson et al. . | |
|---|---|---|---|---|
| 4,894,656 | | 1/1990 | Hwang et al. . | |
| 5,047,772 | | 9/1991 | Ribner . | |
| 5,075,880 | | 12/1991 | Moses et al. . | |
| 5,103,229 | * | 4/1992 | Ribner .................................. | 341/143 |
| 5,142,286 | | 8/1992 | Ribner et al. . | |
| 5,157,395 | | 10/1992 | Del Signore et al. . | |
| 5,369,403 | | 11/1994 | Temes et al. . | |
| 5,406,283 | | 4/1995 | Leung . | |
| 5,420,584 | | 5/1995 | Norsworthy . | |
| 5,471,209 | * | 11/1995 | Sutterlin et al. ...................... | 341/143 |
| 5,648,777 | | 7/1997 | Bays et al. . | |
| 5,659,315 | | 8/1997 | Mandl . | |
| 5,668,549 | | 9/1997 | Opris et al. . | |
| 5,682,161 | * | 10/1997 | Ribner et al. ......................... | 341/143 |
| 5,896,101 | * | 4/1999 | Melanson .............................. | 341/143 |

OTHER PUBLICATIONS

Carley, L. Richard, "An Oversampling Analog–to–Digital Converter Topology for High–Resolution Signal Acquisition System," *IEEE*, (Jan. 1987): 83–90.

Leung, B., Architecture for Multi–Bit Oversampled A/D Converter Employing Dynamic Element Matching Techniques, *IEEE*, 1657–1660.

Leung, B., "Pipelined Multibit Oversampled Digital–to–Analog Converters with Capacitor Averaging," *Analog Integrated Circuits and Signal Processing 2*, (1992): 139–156.

Lin et al., A 13–b 2.5–MHz Self–Calibrated Pipelined A/D Converter in 3—μ m CMOS, *IEEE Journal of Solid State Circuits*, vol. 26, No. 4 (Apr. 1991): 628–636.

Song et al., "A 12–bit 1–Msample/s Capacitor Error–Averaging Pipelined A/D Converter," *IEEE Journal of Solid–State Circuits*, vol. 23, No. 6 (Dec. 1988) 1324–1333.

* cited by examiner

*Primary Examiner*—Brian Young
*Assistant Examiner*—John B. Nguyen
(74) *Attorney, Agent, or Firm*—Samuels, Gauthier & Stevens, LLP

(57) ABSTRACT

A pipelined oversampling analog-to-digital converter having a first conversion block including inputs for receiving an analog input signal and an analog reference signal, and a plurality of conversion blocks following the first conversion block. Each conversion block includes means for receiving the analog input signal and the analog reference signal, and at least one analog integrator input and at least one digital decimator input from a previous conversion block; a D/A converter having at least one distinct analog output level and an analog input of the analog reference signal; at least one integrator; a quantizer that computes at least one bit as an output; means for combining the output of the quantizer with the at least one digital decimator input; and means for providing an analog output signal output, at least one analog integrator output, and at least one digital decimator output to a following conversion block. A result is generated from the at least one digital decimator output at the last of the conversion blocks.

4 Claims, 19 Drawing Sheets

US 6,198,417 B1

PIPELINED OVERSAMPLING A/D CONVERTER

PRIORITY INFORMATION

This application claims priority from provisional application Ser. No. 60/073,040 filed Jan. 29, 1998.

This invention was made with government support under Contract Number F19628-90-C-0002 awarded by the Air Force. The government has certain rights in the invention.

BACKGROUND OF THE INVENTION

The invention relates to the field of A/D converters, and in particular to a pipelined oversampling A/D converter.

Oversampled $\Delta\Sigma$ modulation is a technique that is commonly used for implementing high precision analog-to-digital (A/D) converters. It involves converting an analog input into a coarse digital code at a frequency much higher than the Nyquist rate, and then digitally decimating this code to produce a higher resolution, lower data rate result.

Single-loop systems, such as that illustrated in FIG. 1, are the simplest example of $\Delta\Sigma$ converters. FIG. 1 is a schematic block diagram of a first order $\Delta\Sigma$ A/D converter 100 that includes an analog modulator 102 and a digital decimator 104. The modulator 102 consists of a discrete-time integrator 106, a coarse analog-to-digital converter (ADC) 108, and a coarse digital-to-analog converter (DAC) 110, connected in a feedback configuration. The ADC and DAC are often 1-bit elements. The modulator's front end performs analog operations, while its output is digital. The decimator 104 is strictly digital and consists of a lowpass filter 112 followed by a downsampler 114.

The modulator can be analyzed by modeling ideal quantization noise and other sources of non-ideal noise, introduced by the feedforward ADC, as an additive error, $e_r$. The modulator's output is then described by the difference equation $$w_r[n]=s_i[n-1]+e_r[n]-e_r[n-1]. \quad (1)$$

Node $w_r$ contains signal information, unchanged except for a delay, and the 1st-order difference of feedforward ADC quantization noise.

FIG. 2 shows the time-domain characteristics of the modulator's output $w_r$. The duty cycle represents the converter's average analog input. An input greater than half of the full-scale value results in a stream of digital bits with more 1s than 0s. Although large error is introduced into each value of $w_r$ by the 1-bit quantization shown here, feedback ensures that the average, or duty cycle, of $w_r$ tracks that of the analog input, $s_i$. Similarly, a signal less than half of the full-scale value results in more 0s than 1s.

Differentiation of the quantization noise, $e_r$, is one form of noise shaping. A frequency domain representation of this process is illustrated in FIG. 3. FIG. 3 is a graph of frequency-domain characteristics of $\Delta\Sigma$ modulation. Shaping reduces noise within the signal bandwidth. In this simple model, it is assumed that $e_r$ is uniformly distributed in frequency before it experiences noise shaping. At the modulator's output, $w_r$ has a z-transform of $$W_r=S_i\cdot z^{-1}+E_r\cdot(1-z^{-1}). \quad (2)$$

The spectral distribution of $e_r$ is shaped as indicated in FIG. 3. Quantization noise energy is reduced at low frequencies but is increased at high frequencies. The response of a simple sinc$^2$ decimation filter is shown in the figure. Input signals are restricted to frequencies within the decimator's passband, typically a small fraction of the modulator's total bandwidth. The ratio between modulator sampling frequency and input Nyquist rate is referred to as the oversampling ratio.

The modulator's output, $w_r$, contains input signal components as well as modulation and circuit noise. The decimation filter attenuates its energy outside of the signal bandwidth so that when $w_r$ is resampled at a lower rate, aliasing does not corrupt the signal. Only noise within the signal bandwidth influences the converter's result. In the final stages of decimation, downsampling converts the filter's output from a series of low resolution, high frequency words to a series of higher-resolution words at the Nyquist rate. Resolution in the converter's output words is increased by 9 dB, or 1.5 bits, for every doubling of the oversampling ratio.

The 1st-order architecture described above is the simplest example of an oversampling $\Delta\Sigma$ modulator. It contains only a single feedback loop. However, single-loop modulators require large oversampling ratios to achieve high resolution. The need for a large oversampling ratio is alleviated by use of 2nd-order $\Delta\Sigma$ modulation.

FIG. 4 is a schematic block diagram of a second order $\Delta\Sigma$ system 400 which includes a modulator 402 and a decimator 404. The system contains two nested feedback loops within its modulator. The inner loop is similar to that of a 1st-order modulator, with an integrator 406, a coarse ADC 408, and a coarse DAC 410. The outer loop adds a second analog integrator 412, cascaded with the first integrator, and an outer feedback path. The decimator 404 is also modified to include first 414, second 416 and third 418 stages of digital accumulation with a downsampler 420.

In this architecture, the modulator's output has a z-transform of $$W_r=S_i\cdot z^{-2}+E_r\cdot(1-z^{-1})^2, \quad (3)$$

which contains delayed signal information plus the 2nd-order difference of quantization and other errors in the feedforward path. In comparison to first order, this modulator is capable of greater resolution for the same oversampling ratio because its higher-order noise shaping leaves less noise energy within the signal band. Resolution in the converter's output word is improved by 15 dB, or 2.5 bits, for every doubling of the oversampling ratio.

$\Delta\Sigma$ techniques offer a number of advantages that make them well suited for high-resolution A/D conversion. First, high resolution is achieved despite inaccuracies of internal circuit components such as the ADC. In contrast, component imperfections generally limit non-oversampling architectures to about 12-bit resolution. Second, high resolution is achieved from an ADC with only a few levels and these levels do not require great precision. The ADC in a 1-bit system is particularly simple to implement because it consists of a single comparator. A third advantage is that high resolution is possible from a DAC with only a few levels. Although full resolution is required from the placement of these levels, 1-bit systems are capable of excellent linearity because they contain only two DAC levels and variation in the placement of these does not introduce nonlinearity. A final advantage is that antialias filtering at the converter's input is simplified because the decimator serves as a digital antialias filter.

The advantages of $\Delta\Sigma$ techniques arise through a series of tradeoffs. First, higher accuracy is achieved at the expense of a drastic increase in the number of operations required. The number of operations performed by non-oversampling architectures, such as successive approximation, increases linearly with converter bits, whereas for A) converters it increases exponentially. In a second tradeoff, ΔΣ converters achieve simplicity in their analog circuitry by moving processing complexity into the digital domain. Decimation filters with a flat passband response and a sharp cutoff transition often constitute a majority of the complexity, chip area, and power dissipation of such a device. In a third tradeoff, resolution is improved by a longer decimator impulse response at the expense of increased converter settling time.

Finally, ΔΣ techniques include an inherent tradeoff between speed and resolution, whereby these characteristics are not independently adjustable. An increase in the oversampling ratio improves resolution, but reduces the data rate. Similarly, a decrease in the oversampling ratio improves the data rate at the expense of resolution. Data rates are limited because the modulator must operate over many clock cycles to produce a single result. This speed-resolution tradeoff has been the subject of much attention. Data rates are improved by higher-order modulators, but those of greater than second order are susceptible to instability and have increased circuit complexity. Data rates are improved by use of multi-bit quantizers, but their success has been limited by the accuracy required from multi-bit feedback elements. More recently, multi-bit quantizers with single-bit feedback have been used to reduce oversampling ratios, but these devices continue to be limited by a fixed speed-resolution product.

SUMMARY OF THE INVENTION

Accordingly, the invention provides an analog-to-digital converter having a first conversion block including inputs for receiving an analog input signal and an analog reference signal, and a plurality of conversion blocks following the first conversion block. Each conversion block includes means for receiving the analog input signal and the analog reference signal, and at least one analog integrator input and at least one digital decimator input from a previous conversion block; a D/A converter having at least one distinct analog output level and an analog input of the analog reference signal; at least one integrator; a quantizer that computes at least one bit as an output; means for combining the output of the quantizer with the at least one digital decimator input; and means for providing an analog output signal output, at least one analog integrator output, and at least one digital decimator output to a following conversion block. A result is generated from the at least one digital decimator output at the last of the conversion blocks.

In accordance with another embodiment of the invention there is provided an analog-to-digital converter having a first conversion block including an input for receiving an analog input signal and a plurality of conversion blocks following the first conversion block. Each conversion block includes means for receiving the analog input signal, at least one analog integrator input, and at least one digital decimator input from a previous conversion block; at least one digital integrator having an input coupled to the at least one digital decimator input; a multiplying first D/A converter having at least one distinct analog output level and an analog reference input coupled to the analog input signal; a second D/A converter having at least one distinct analog output level and a digital input coupled to the at least one digital decimator input; at least one analog integrator, the first of which has inputs coupled to the output of the first D/A converter and the output of the second D/A converter; a quantizer that computes at least one bit as an output and having an input coupled to the output of the last of the at least one integrator; means for combining the output of the quantizer with the at least one digital decimator input; and means for providing an analog output signal, at least one analog integrator output, and at least one digital decimator output to a following conversion block. A result is generated from the at least one digital decimator output at the last of the conversion blocks.

In accordance with yet another embodiment of the invention there is provided an analog-to-digital converter having a first conversion block including an input for receiving an analog input signal and a plurality of conversion blocks following the first conversion block. Each conversion block includes means for receiving the analog input signal, at least one analog integrator input, and at least one digital decimator input from a previous conversion block; at least one digital integrator having an input coupled to the at least one digital decimator input; a multiplying first D/A converter having at least one distinct analog output level and an analog reference input coupled to the analog input signal; a second D/A converter having at least one distinct analog output level and a digital input coupled to the at least one digital decimator input; a quantizer that computes at least one bit as an output and having an input coupled to the output of the first D/A converter and the output of the second D/A converter; means for combining the output of the quantizer with the at least one digital decimator input; and means for providing an analog output signal and at least one digital decimator output to a following conversion block. A result is generated from the at least one digital decimator output at the last of the conversion blocks.

DETAILED DESCRIPTION OF THE INVENTION

Figure 5A:
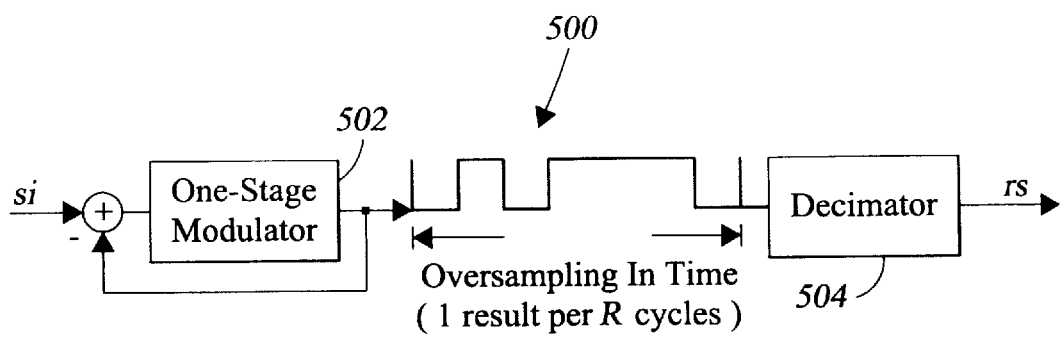
FIG. 5A is a schematic block diagram of a converter having a single modulator and a decimator operating over many clock cycles to produce a train of digital outputs.

Pipelining can be applied to oversampling converters to circumvent their speed-resolution tradeoff and its associated limitations. Conventional and pipelined architectures are compared in FIGS. 5A and 5B. FIG. 5A is a schematic block diagram of a converter 500 having a single modulator 502 and a decimator 504 operating over many clock cycles to produce a train of digital outputs. Many of these bits are combined within the decimator to generate a single higher-resolution digital result. Each result in a converter with an oversampling ratio of R requires an additional R clock cycles of operation. This type of operation is referred to hereinafter as time oversampling.

The operations performed in FIG. 5A can also be implemented in a pipelined fashion. Such a configuration is shown in FIG. 5B.

Figure 5B:
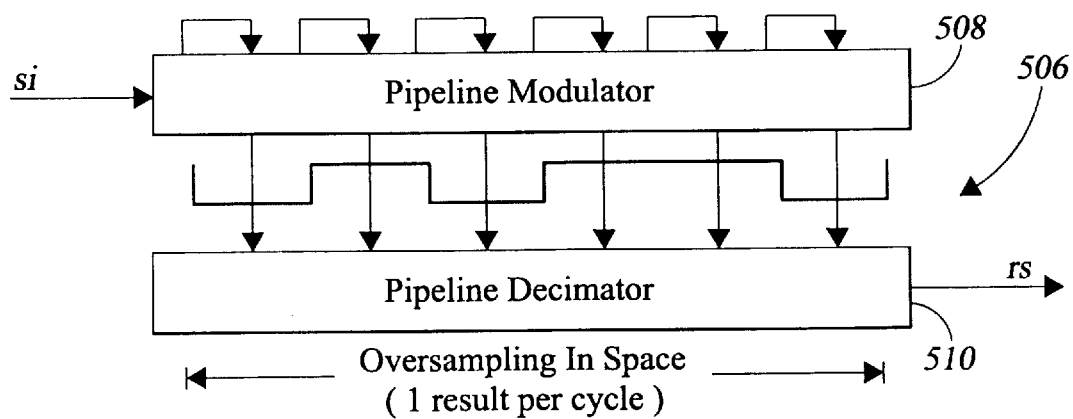
FIG. 5B is a schematic block diagram of a converter having a pipelined modulator and a pipelined decimator.

FIG. 5B is a schematic block diagram of a converter 506 having a pipelined modulator 508 and a pipelined decimator 510. The analog input is initially sampled by the first pipeline stage. The modulator's feedback loop is unraveled into a chain of many stages that operate sequentially on this input sample. The decimator, which is pipelined as well, accepts the modulator's outputs at each stage. Signals from all pipeline stages are combined in the decimator to produce a result at the end of the pipeline.

Since oversampling in a pipelined structure occurs sequentially in space rather than sequentially in time, resolution is determined by the pipeline length. The converter's data rate is equal to the clock rate at which the pipeline is operated. Since these two parameters are independently adjustable, there is no longer a speed-resolution tradeoff.

Figure 6A:
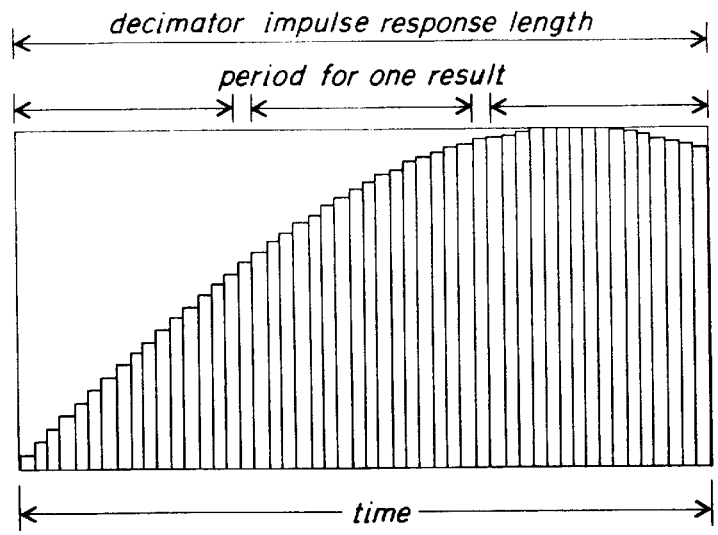
FIGS. 6A and 6B are graphs comparing signals in time-oversampling and pipelined devices, respectively.
Figure 6B:
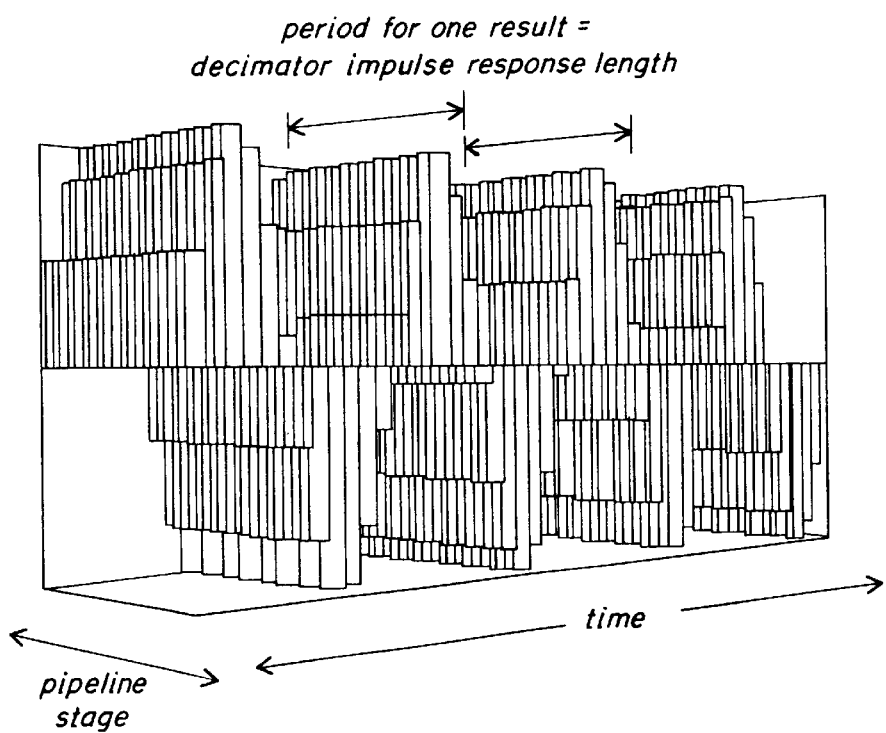

FIGS. 6A and 6B compare signals in time-oversampling and pipelined devices, respectively. The analog input to a time-oversampling converter is shown in FIG. 6A as a slowly varying sinewave that is sampled at a frequency much greater than its Nyquist rate. Many input samples are collected during the period for one result. A lowpass filter is applied to samples from a longer time interval, equal to the decimator's impulse response length. The input may vary during each of these intervals, although it can not change rapidly.

Figure 7A:
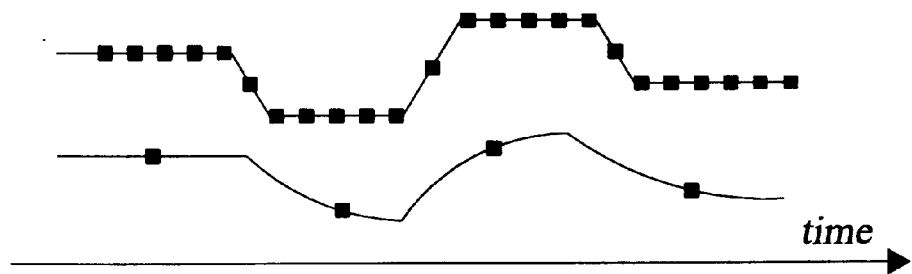
FIGS. 7A and 7B are graphs showing sampling of clocked waveforms.
Figure 7B:
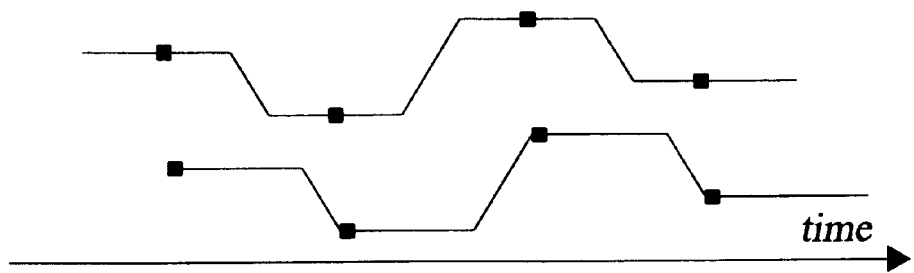

Lowpass filtering in the decimator for such a device has a number of consequences. First, the decimator serves as a digital antialias filter because noise outside of its passband is suppressed. This noise might already be present on the incoming signal or might arise as a result of sampling at the converter's input. However, both desirable and undesirable high-frequency components of the input signal are suppressed. FIGS. 7A and 7B are graphs showing sampling of clocked waveforms. FIG. 7A shows that time oversampling is limited by a long settling time, while FIG. 7B shows that pipelined oversampling performs Nyquist sampling.

FIG. 7A is an example where lowpass filtering is undesirable. The converter's presampled input is shown by the upper waveform. Samples of it, indicated by dots, occur during both plateau and transition regions. Since the filter's impulse response length covers multiple plateau regions, there is mixing between consecutive outputs. The converter's output, shown by the lower curve in FIG. 7A, has a long settling time in response to each step transition. When downsampling is performed, the result does not accurately represent the original input.

Data flow for a pipelined device is shown in FIG. 6B. The analog input is shown as a sinewave that is rapidly varying along the time axis. A sequence of samples of this waveform are captured by the first pipeline stage. An additional dimension of space is used to represent position along the pipeline. After each sample is captured, it is passed unchanged along the pipeline and is used by each stage toward computation of a final output. Therefore, from the perspective of the $\Delta\Sigma$ computation, the input is constant.

Figure 8:
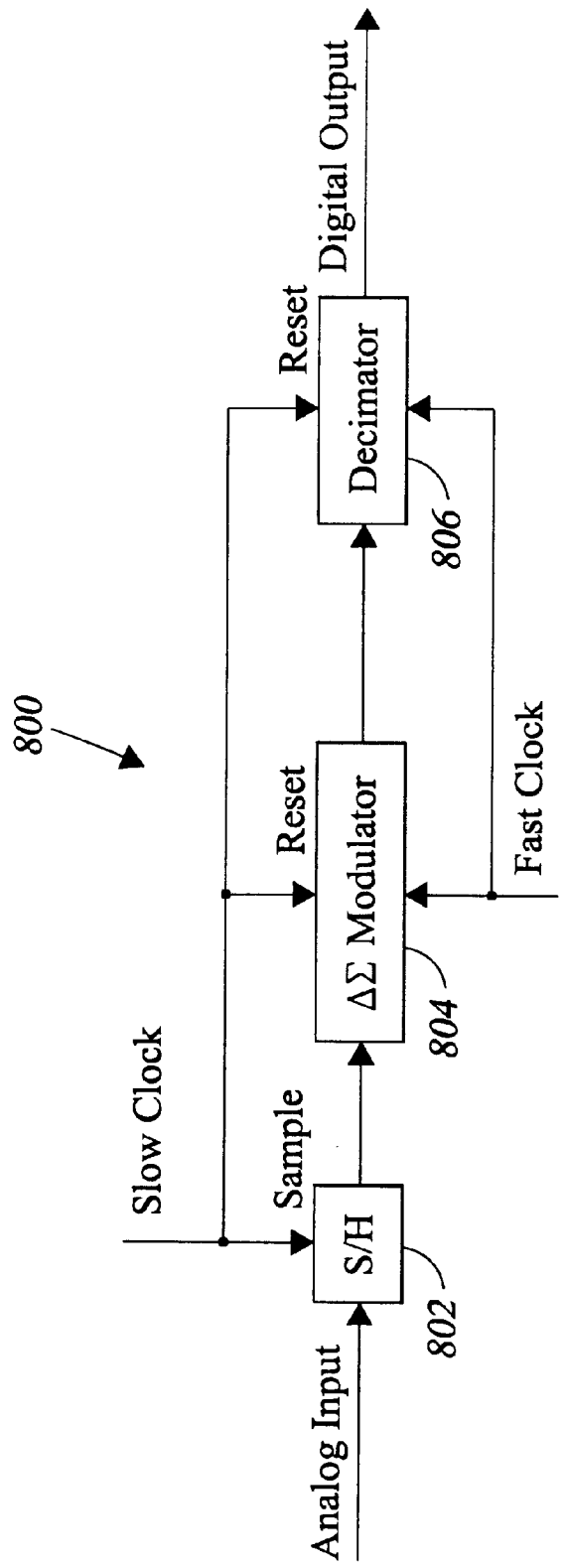
FIG. 8 is a schematic block diagram of a time-oversampling converter.

Computationally a pipelined oversampling converter (POSC) is similar to a time-oversampling converter configured as shown in FIG. 8. FIG. 8 is a schematic block diagram of a time-oversampling converter 800 having a sample-and-hold 802, a modulator 804 and a decimator 806. A low frequency clock is used to reset integrators in the modulator, reset memory in the decimator, and perform sampling of an analog input. The sampled input is held constant while the modulator and decimator operate on it over many cycles using a higher frequency clock. The converter's result is transferred to its output on the next slow clock edge, at the same time that the next phase of resetting and sampling occurs.

Each output word from a POSC is generated from a single sample of the incoming analog waveform and is processed independently from its neighbors. As a result, a pipelined device performs Nyquist sampling. FIG. 7B illustrates the operation with presampled signals. The converter's input, shown by the upper waveform is sampled at the times denoted by dots. One sample is captured during each plateau and each of these is used to compute an output word. There is no mixing between adjacent computations and the converter's output, shown by the lower waveform, accurately reproduces its input. The benefits of Nyquist sampling in a POSC do, however, come at a price. As with any Nyquist-sampling converter, an analog antialias filter must precede a pipelined converter to prevent high frequency noise from aliasing into the signal passband.

A POSC has a number of unique attributes that differentiate its $\Delta\Sigma$ algorithm from that of a time-oversampling device. These include integrator resetting in the modulator, accumulator resetting in the decimator, an input signal that is effectively constant, an input signal whose form is precisely known, and a constrained filter impulse response length. These aspects are described in more detail hereinafter.

Figure 9:
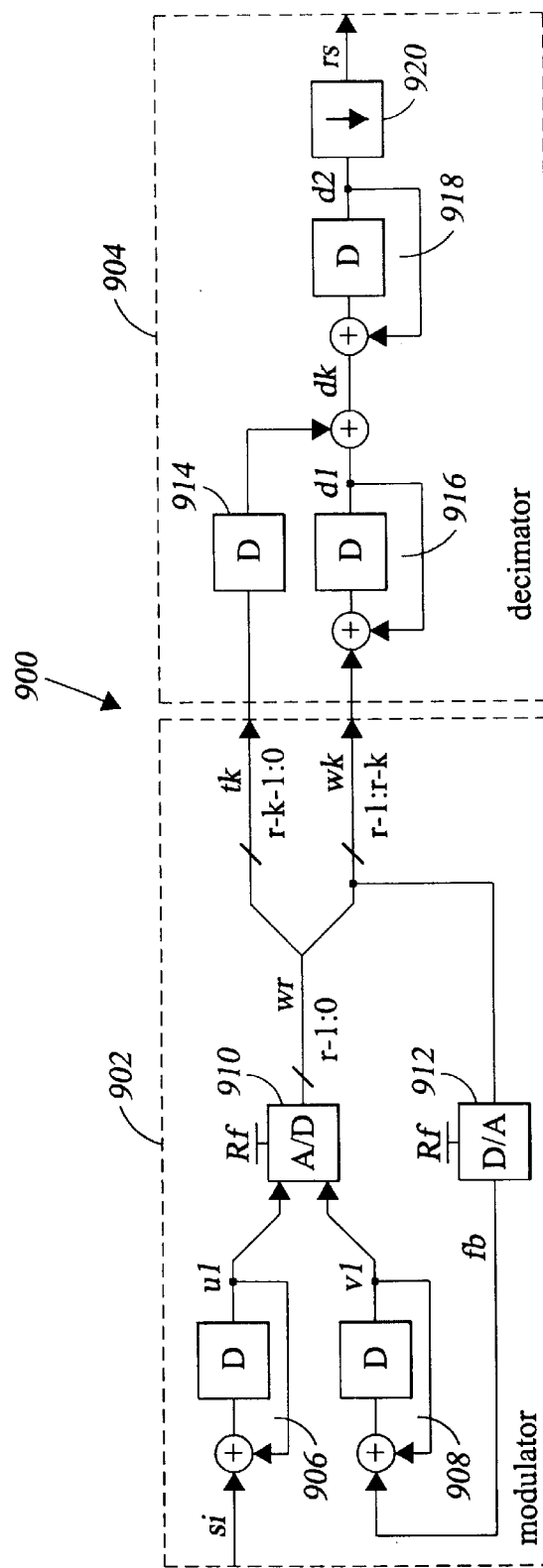
FIG. 9 is a schematic block diagram of a POSC utilizing a first order algorithm in cyclic form.

The POSC architectures in accordance with the invention are based on the 1st-order devices described heretofore with modifications. FIG. 9 is a schematic block diagram of a POSC 900 utilizing a first order algorithm in cyclic form. The converter 900 includes a modulator 902 and a decimator 904. Initially, the integrator $i_1$ is replaced with first 906 and second 908 integrators, $u_1$ and $v_1$. The modulator also includes a coarse ADC 910 and a coarse DAC 912 in a feedback loop.

Each accumulator loop in the decimator 904 is modified to include a delay 914 in its feedforward path, in addition to first 916 and second 918 accumulators and a downsampler 920. This configuration is more appropriate for a pipelined implementation where each operation occupies one pipeline stage.

Figure 1:
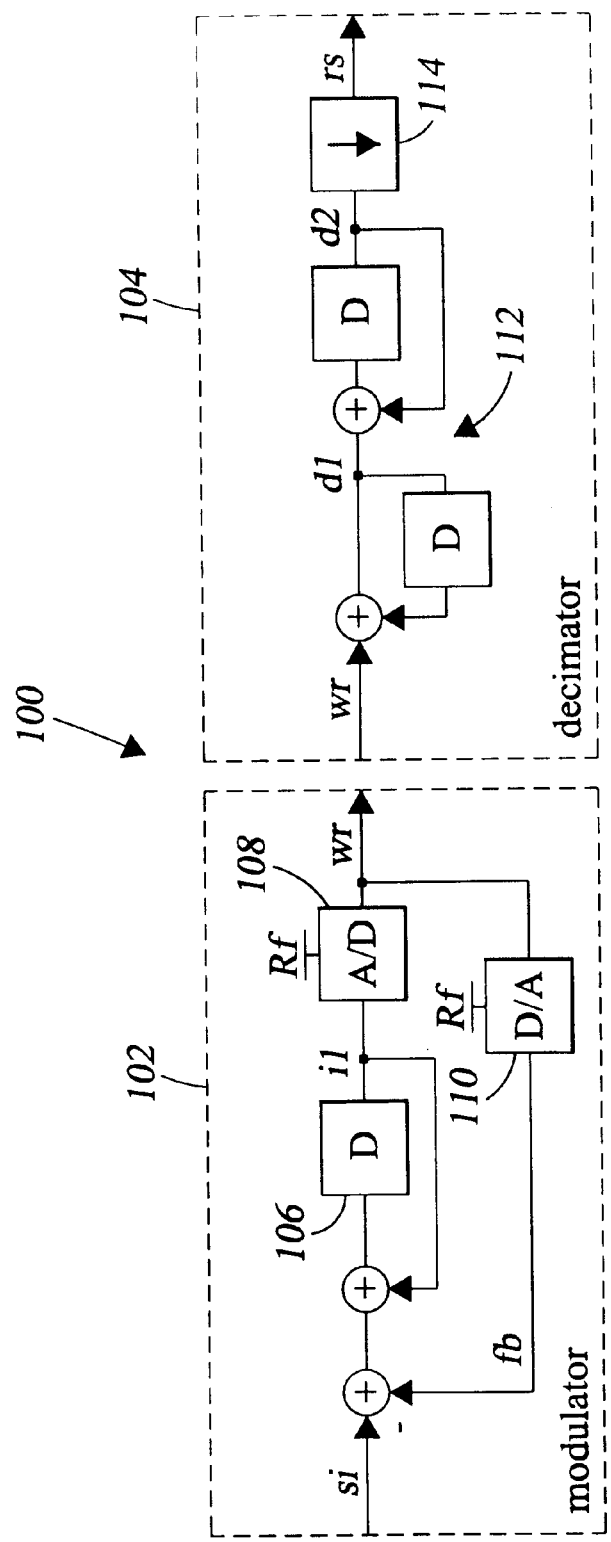
FIG. 1 is a schematic block diagram of a first order ΔΣ A/D converter.
Figure 2:
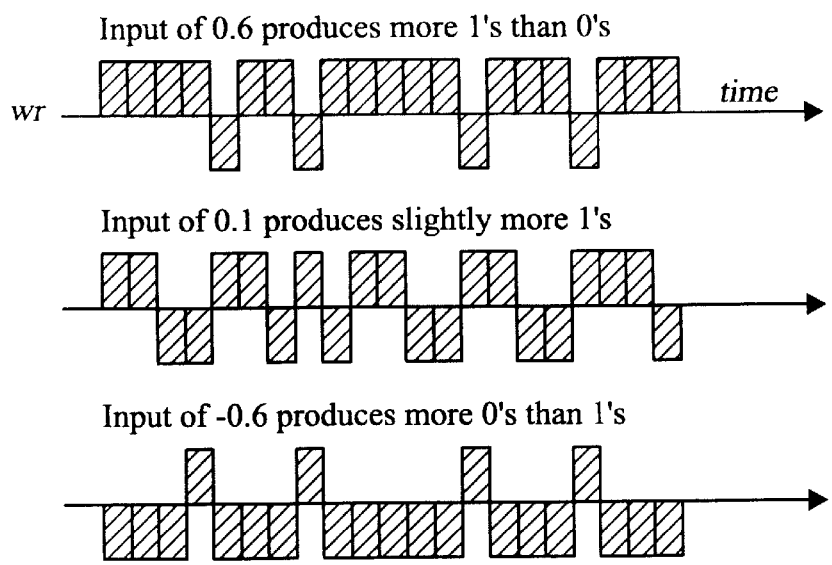
FIG. 2 is a time graph showing the time-domain characteristics of the modulator of FIG. 1 output $w_r$.
Figure 3:
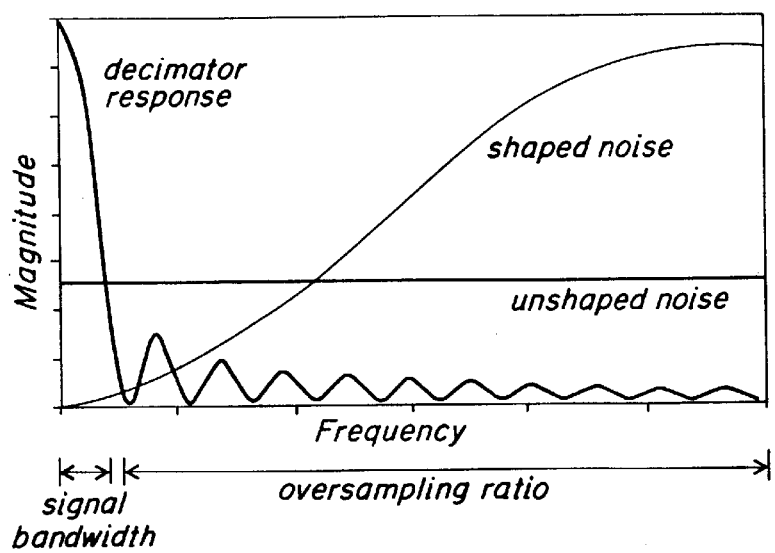
FIG. 3 is a graph of frequency-domain characteristics of ΔΣ modulation.

An incoming analog signal is sampled at the converter's input, where n=0. $S_g$ is a constant equal to the value of this sample and the modulator's input sequence, $s_i$, is equal to $$s_i[n] = S_g \cdot u[n],\qquad(4)$$

where u[n] is a unit step function. Integrator 906 ($u_1$) integrates signal information, via $s_i$, and integrator 908 ($v_1$) integrates feedback information, via feedback $f_b$. The difference between their values is similar to the integrated quantity $i_1$ of FIG. 1. However, as shown, this configuration is single-ended, not differential, and $u_1$ and $v_1$ are not a differential pair.

All integrators are preset to zero at time n=0, and their values at cycle n are given by $$u_1[n] = \begin{cases} 0 & \text{for } n \leq 0 \\ u_1[n-1] + s_i[n-1] & \text{for } n \geq 1 \end{cases}\qquad(5)$$

$$v_1[n] = \begin{cases} 0 & \text{for } n \leq 0 \\ v_1[n-1] + f_b[n-1] & \text{for } n \geq 1 \end{cases}$$

The value of integrator 906 ($u_1$) increases linearly with time because $S_g$ is unconditionally added to it each cycle. Feedback ensures that $u_1$ and $v_1$ coarsely track each other, so $v_1$ increases with the same slope.

The coarse ADC 910 with a full-scale value of reference $R_f$ (same for all stages) generates an r-bit digital representation $$w_r[n] = \frac{1}{R_f}(u_1[n] - v_1[n]) + e_r[n]\qquad(6)$$

of the difference between $u_1$ and $v_1$. The expression for $w_r$ contains an error term, $e_r$, that is due to r-bit quantization as well as circuit inaccuracies in the coarse ADC. As defined in equation (6), $e_r$ is normalized to the full scale.

The k most significant bits of $w_r$ are used to form the modulator's first output and its feedback value $$w_k[n] = \frac{1}{R_f}(u_1[n] - v_1[n]) + e_r[n] - t_k[n].\qquad(7)$$

This signal contains an additional error term, $t_k$, that is due to truncating an r-bit word to k bits. In contrast to error $e_r$, error $t_k$ is a known quantity and can be compensated for in downstream digital processing. It is provided as an input to the decimator for this purpose. Errors $e_r$ and $t_k$ are both zero for n<1 since no comparisons occur during this time.

Node $w_k$, is supplied to the feedback DAC 912 with a full-scale value of $R_f$ that generates a corresponding analog quantity $$f_b[n] = u_1[n] - v_1[n] + R_f(e_r[n] - t_k[n]).\qquad(8)$$

Node $w_r$ represents the difference $u_1 - v_1$ quantized with 5-bit resolution. Node $f_b$ is a 2-bit representation of $w_r$ and is always smaller than it as a result of truncation. Since the average of $f_b$ approximates the value of $S_g$, the average of $w_r$ is always greater than or equal to $S_g$.

Solving equations (5), (7), and (8) recursively yields a time-domain and frequency-domain modulator output of $$w_k[n] = \frac{S_g}{R_f} \cdot u[n-1] + (e_r[n] - e_r[n-1]) - (t_k[n] - t_k[n-1])\qquad(9)$$

$$W_k(z) = \frac{S_g}{R_f} \cdot \frac{z^{-1}}{(1-z^{-1})} + (E_r - T_k) \cdot (1-z^{-1})$$

Signal $w_k$ contains a delayed version of the input sample plus the 1st-order difference of errors $e_r$ and $t_k$.

The decimator's purpose is to amplify signal information and attenuate quantization noise in the modulator's digital output. One example of such a decimator is shown in FIG. 9. The decimator's 904 first stage accumulates $w_k$ according to $$d_1[n] = \begin{cases} 0 & \text{for } n \leq 1 \\ d_1[n-1] + w_k[n-1] & \text{for } n \geq 2 \end{cases}\qquad(10)$$

Solving equations (9) and (10) yields the response $$d_1 = \frac{S_g}{R_f} \cdot (n-1) \cdot u[n-1] + (e_r[n-1] - t_k[n-1]),\qquad(11)$$

containing signal information that increases linearly with n at a rate of $S_g/R_f$, and unamplified error that has a constant mean-square value.

Truncation error is digitally corrected after the first accumulator 916 by adding $t_k$ to $d_1$.

The result, $$d_k[n] = \frac{S_g}{R_f} \cdot (n-1) \cdot u[n-1] + e_r[n-1],\qquad(12)$$

represents the number of times $R_f$ was added to the first integrator 906 ($v_1$) over the previous n−1 cycles. Equation (12) could be used directly to reconstruct the input sample, $S_g$. However, better resolution is achieved from a second stage of accumulation. The accumulated result $$d_2[n] = \begin{cases} 0 & \text{for } n \leq 2 \\ d_2[n-1] + d_k[n-1] & \text{for } n \geq 3 \end{cases}\qquad(13)$$

has a value at time n of $$d_2[n] = \frac{S_g}{2 \cdot R_f}(n-2)(n-1) \cdot u[n-2] + \sum_{i=1}^{n-2} e_r[i]\qquad(14a)$$

and a corresponding z transform of $$D_2 = \frac{S_g}{R_f} \cdot \frac{z^{-3}}{(1-z^{-1})^3} + (E_r - T_k)\frac{z^{-2}}{(1-z^{-1})}.\qquad(14b)$$

Signal information in $d_2$ is amplified as $n_2$ while the quantization noise term increases more slowly as $\sqrt{n}$. The value of $d_2$ is independent of both truncation error $t_k$ and of the number of feedback bits k. It does, however, depend on the number of ADC bits, r, because this determines the mean-square value of $e_r$. This configuration is referred to hereafter as an error-averaging decimator because the final term in equation (14a) contains an average of $e_r$.

The input sample is easily reconstructed from $d_2$. Since the sequence $s_i$ is constant, equations (14a) and (14b) can be solved directly for $S_g$ in terms of $d_2$ and n. The quantization noise term is assumed to be negligible. For a P-stage pipeline, the final value of $d_2$ is completed at time n=P+2 and reconstruction is given by $$S_g \approx d_2[P+2] \cdot \left( \frac{2R_f}{P^2+P} \right). \tag{15}$$

Equation (15) has a particularly simple implementation if the pipeline length P is chosen so that the term $P_2+P$ is a power of two. In this case, the result is identically equal to $d_2$ with a change in significance of its bits. Alternatively, the term $P_2+P$, which only impacts converter gain, could be treated as part of the full-scale value.

The term "pipeline stage" is used heretofore to describe both the hardware comprising one feedback operation and the hardware exercised during one clock period. This terminology must be modified here because the pipelined structures used to implement a POSC often utilize multiple clock cycles to perform one feedback operation. To differentiate between these, the former is referred to as a "conversion block" and the latter is referred to as a "stage". Using this convention, a conversion block might contain multiple stages.

Figure 10A:
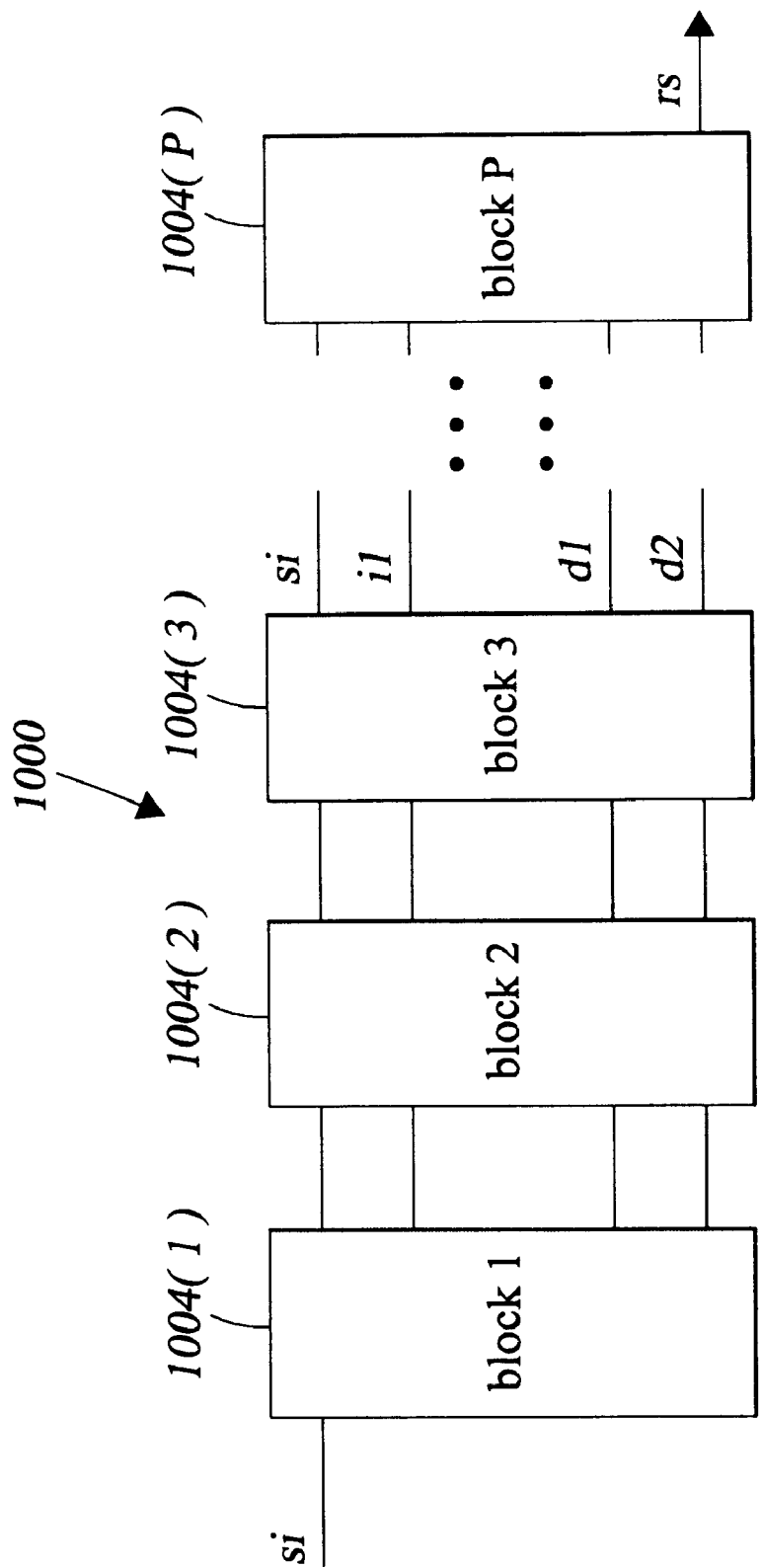
FIGS. 10A and 10B are schematic block diagrams of a first order POSC that is a pipelined implementation of the converter of FIG. 9, and an nth block, respectively
Figure 10B:
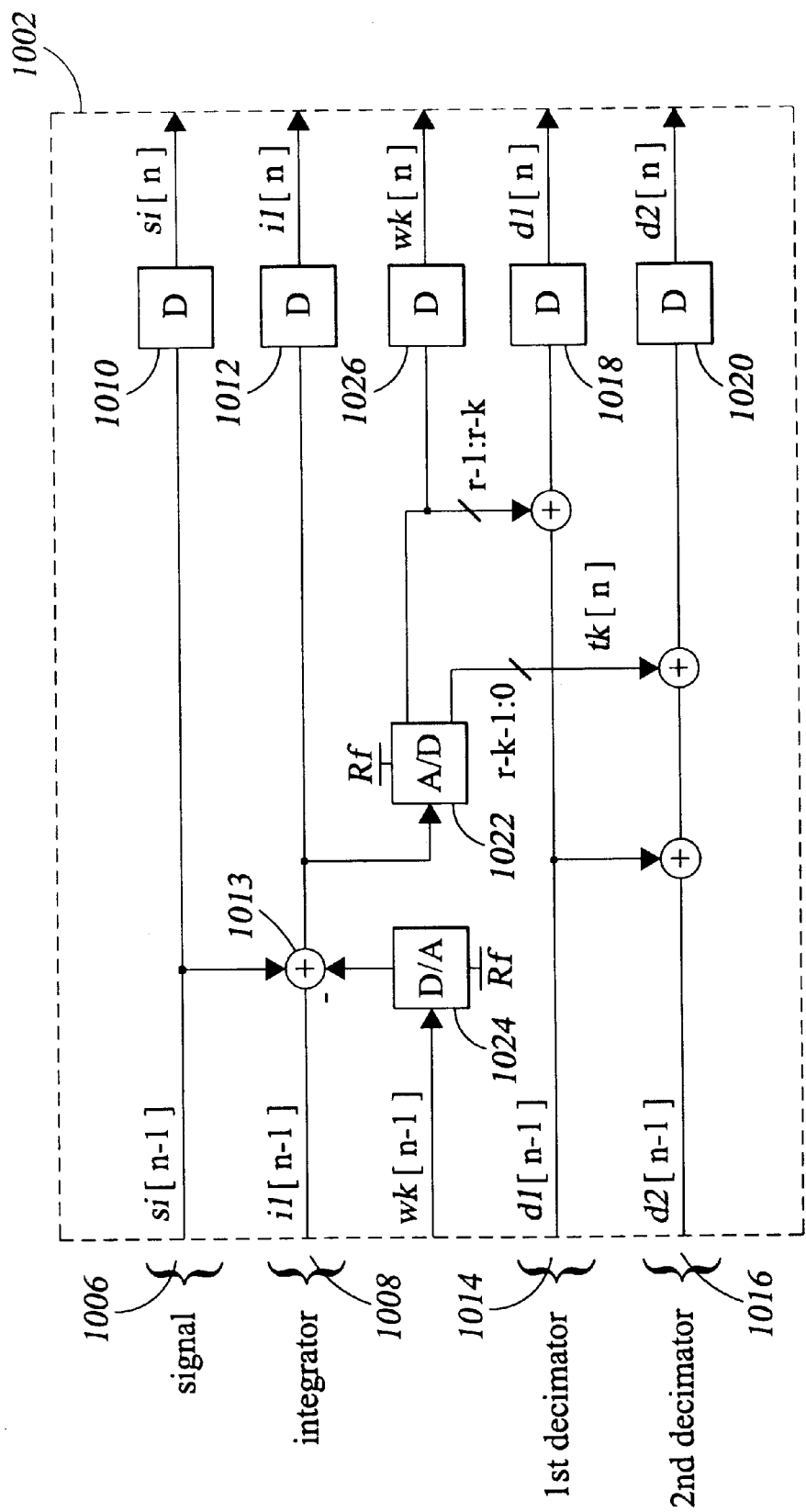

FIGS. 10A and 10B are schematic block diagrams of a first order POSC 1000 that is a pipelined implementation of the converter 900 of FIG. 9, and an nth block 1002, respectively. The pipeline in FIG. 10A contains P conversion blocks 1004(1)–1004(P). Two analog channels, a signal channel 1006 ($s_i$) and an integrator channel 1008 ($i_1$), flow through the pipeline and include respective delays 1010 and 1012. The integrator channel 1008 also includes an integrator 1013. Two digital channels, a first decimator channel 1014 ($d_1$) and a second decimator channel 1016 ($d_2$), carry decimator signals. The decimator channels include respective delays 1018 and 1020.

Before the first conversion block, the states of $i_1$, $d_1$, and $d_2$ are all set to zero. The converter's analog input is sampled by the first block and is passed unchanged along the pipeline. The converter's final result is generated by normalizing $d_2$ from the last block using equation (3–15). Multiple input samples are processed in parallel along the pipeline so that a new digital word is completed at each clock cycle.

The contents of a single conversion block are shown schematically in FIG. 10B. Subscripts of n are used to denote outputs from the nth block. Each element labeled D performs delay and latching operations. An ADC 1022 is a coarse r-bit A/D converter, with a full-scale reference of $R_f$, that is implemented using a non-oversampling architecture such as one-bit-per-stage successive approximation. The ADC 1022 operates as a quantizer as implemented. A DAC 1024 represents a coarse k-bit D/A converter, with a full-scale reference $R_f$, which is also implemented using a non-oversampling architecture.

Each block accepts a feedback signal $w_k$ from its predecessor and generates a corresponding analog quantity that is subtracted from the delayed input sample, $s_i$. The result, after subtraction, is added to integrator 1013. An r-bit quantized representation of this integrator's value is divided into upper and lower bits. The k upper bits form the feedback signal $w_k$. These are added to the first decimator channel 1014 and are passed forward to the next block via delay 1026. The only digital signal from block n that is needed by block n+1 is $w_k$. Signals $d_1$ and $d_2$ are not needed until the pipeline's end, and their computations can, therefore, be reordered or spread across multiple conversion blocks. An example of this is shown in FIG. 10B. The delay shown in FIG. 9 for $t_k$ is eliminated and $t_k$ is added directly to $d_2$. At the completion of these operations all results are passed forward to a subsequent conversion block.

The configuration in FIG. 10B is not well suited for high-speed operation because each conversion block contains only one delay. All of its operations, including D/A conversion, addition, subtraction, and A/D conversion, must be completed within a single clock period. Speed is improved if each conversion block is divided into multiple pipeline stages, with fewer operations per stage, so that a higher frequency clock can be used. Each feedback operation is then allowed multiple clock cycles to complete. Latency is increased but throughput remains one result per cycle.

Figure 4:
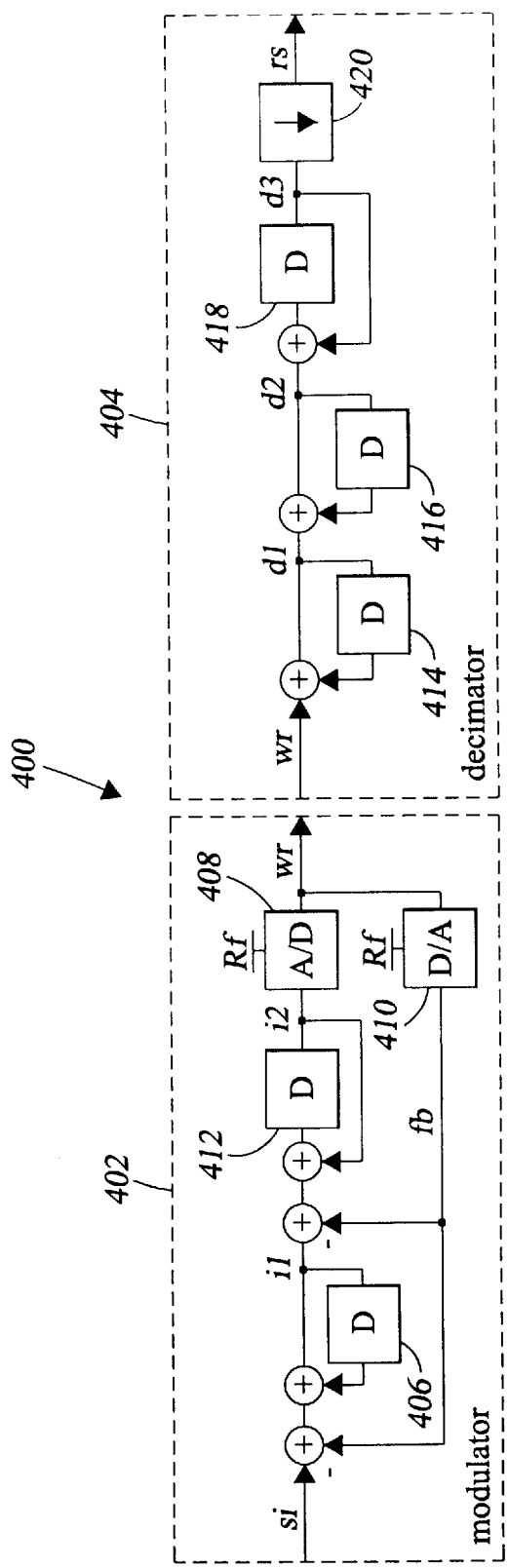
FIG. 4 is a schematic block diagram of a second order ΔΣ system.
Figure 11:
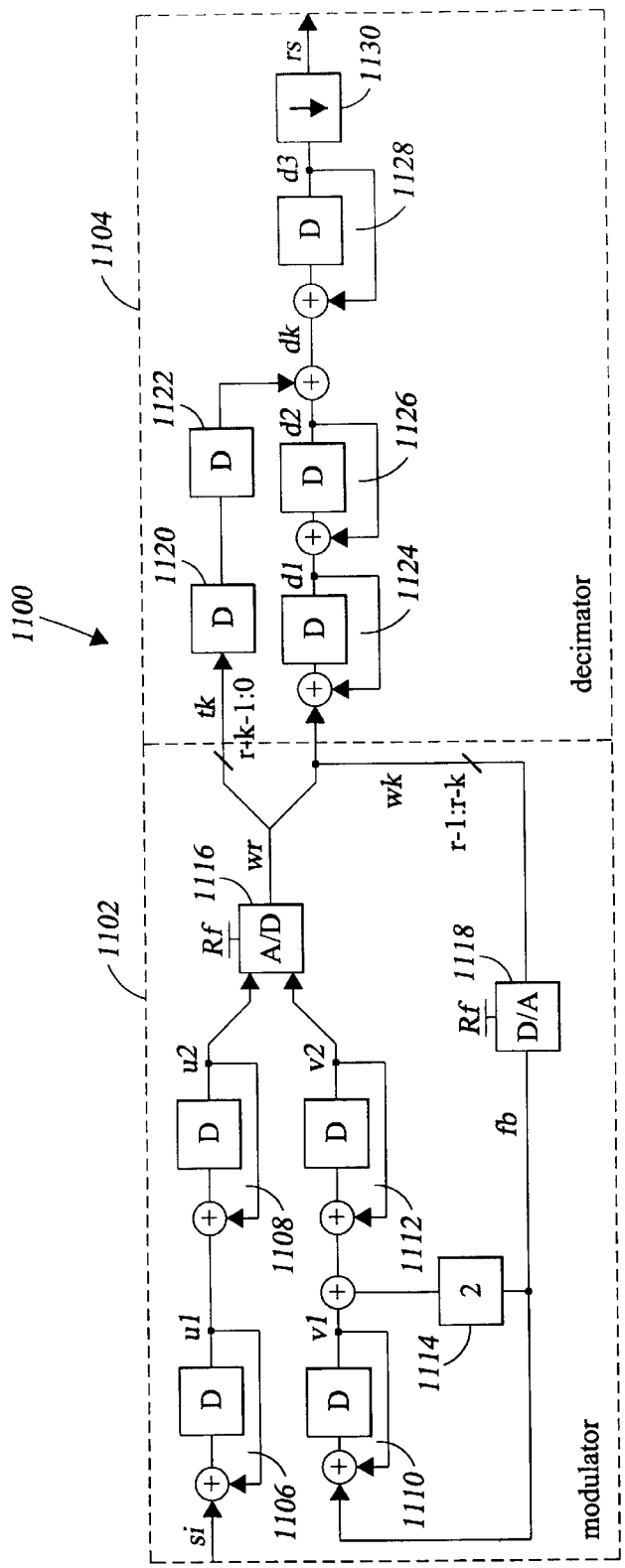
FIG. 11 is a schematic block diagram of a second order POSC.

The first order POSC architecture can be modified as shown in FIG. 11 to accommodate second order modulation. FIG. 11 is a schematic block diagram of a second order POSC 1100. The POSC 1100 includes a modulator 1102 and a decimator 1104. The configuration shown here differs from the time-oversampling configuration of FIG. 4 in three ways. First, integrators $i_1$ and $i_2$ are replaced with pairs of integrators, $u_1/v_1$ and $u_2/v_2$. Integrators 1106 and 1108 are in the analog signal channel and integrators 1110 and 1112 are in a feedback loop. Second, all integrators and accumulators are modified to include a delay in their feedforward paths. This configuration is more appropriate for a pipelined implementation where each operation occupies one stage. Third, a gain of two unit 1114 is added into the inner loop's feedback path to compensate for the additional delay from $f_b$ to $v_1$. Algorithms are illustrated using a cyclic configuration.

The analysis parallels that for first order modulation. The converter's input samples an incoming analog signal. $S_g$ is a constant equal to the value of this sample. The input to the $\Delta\Sigma$ algorithm, $s_i$, equals $$s_i[n] = S_g \cdot u[n], \tag{16}$$

where u[n] is a unit step function. Integrators 1106 ($u_1$) and 1108 ($u_2$) accumulate signal information via $s_i$, and integrators 1110 ($v_1$) and 1112 ($v_2$) accumulate feedback information via $f_b$. The difference between their values is similar to integrated quantities $i_1$ and $i_2$ of FIG. 4.

The modulator's first and second integrators are preset to zero at time n=0 and their values at cycle n are given by $$u_1[n] = \begin{cases} 0 & \text{for } n \leq 0 \\ u_i[n-1] + s_i[n-1] & \text{for } n \geq 1 \end{cases} \tag{17}$$

$$v_1[n] = \begin{cases} 0 & \text{for } n \leq 0 \\ v_1[n-1] + f_b[n-1] & \text{for } n \geq 1 \end{cases}$$

and $$u_2[n] = \begin{cases} 0 & \text{for } n \leq 1 \\ u_2[n-1] + u_1[n-1] & \text{for } n \geq 2 \end{cases} \tag{18}$$

$$v_2[n] = \begin{cases} 0 & \text{for } n \leq 1 \\ v_2[n-1] + v_1[n-1] + 2f_b[n-1] & \text{for } n \geq 2 \end{cases}$$

The values of $u_1$ and $u_2$ increase linearly and quadratically with time. Feedback ensures that $v_1$ tracks $u_1$ and $v_2$ tracks $u_2$.

A coarse ADC 1116 with a full-scale value of $R_f$ generates an r-bit digital representation $$w_r[n] = \frac{1}{R_f}(u_2[n] - v_2[n] + e_r[n]) \tag{19}$$

of the difference between $u_2$ and $v_2$. The error term, $e_r$, in this signal is due to r-bit quantization noise as well as circuit inaccuracies in the coarse ADC.

The modulator's first output and its feedback value, $$w_k[n] = \frac{1}{R_f}(u_2[n] - v_2[n]) + e_r[n] - t_k[n], \quad (20)$$

consists of the k most significant bits of $w_r$. The additional term, $t_k$, results from truncating an r-bit word to k bits and can be digitally corrected for downstream in the decimator. Errors $e_r$ and $t_k$ are zero for n<1 since no comparisons occur during this time.

Node $w_k$, is supplied to a feedback DAC 1118 with a full-scale value of $R_f$ that generates a corresponding analog quantity $$f_b[n] = u_2[n] - v_2[n] + (e_r[n] - t_k[n]) \cdot R_f \quad (21)$$

An iterative solution of equations (17), (18), (20) and (21) yields a time-domain modulator output of $$w_k[n] = \frac{S_g}{R_f} \cdot u[n-2] + \quad (22a)$$
$$(e_r[n] - 2e_r[n-1] + e_r[n-2]) + (t_k[n] - 2t_k[n-1] + t_k[n-2])$$

and a z transform of $$W_k(z) = \frac{S_g}{R_f} \cdot \frac{(z^{-2} - z^{-P-2})}{1 - z^{-1}} + (E_r - T_k)(1 - z^{-1})^2. \quad (22b)$$

This signal contains a delayed version of the input sample, plus the second order difference of errors $e_r$ and $t_k$.

The decimator 1104 includes a feedforward path having delays 1120 and 1122. The signal path includes first 1124, second 1126 and third 1128 accumulators, and a downsampler 1130. The decimator 1104 processes the modulator's output, $w_k$, to amplify signal information and attenuate quantization noise. The first and second accumulators are given by $$d_1[n] = \begin{cases} 0 & \text{for } n \le 2 \\ d_1[n-1] + w_k[n-1] & \text{for } n \ge 3 \end{cases} \quad (23)$$

$$d_2[n] = \begin{cases} 0 & \text{for } n \le 3 \\ d_2[n-1] + d_1[n-1] & \text{for } n \ge 4 \end{cases}.$$

Solving equations (20) and (23) yields responses of $$d_1[n] = \quad (24)$$
$$\frac{S_g}{R_f}(n-2) \cdot u[n-2] + (e_r[n-1] - e_r[n-2]) - (t_k[n-1] - t_k[n-2])$$

and $$d_2[n] = \frac{S_g}{2R_f}(n-3)(n-2) \cdot u[n-3] + e_r[n-2] - t_k[n-2]. \quad (25)$$

Signals $d_1$ and $d_2$ track $u_1$ and $u_2$. They increase linearly and quadratically with n at a rate of $S_g/R_f$. Error terms $e_r$ and $t_k$, which were differentiated at the decimator's input, are restored to their original form, with a constant mean-square value, by point $d_2$.

Truncation error is digitally removed from the second accumulator's 1126 output, $$d_k[n] = \frac{S_g}{2R_f}(n-3)(n-2) \cdot u[n-3] + e_r[n-2]. \quad (26)$$

The final accumulator has a value at time n of $$d_3[n] = \begin{cases} 0 & \text{for } n \le 4 \\ d_3[n-1] + d_k[n-1] & \text{for } n \ge 5 \end{cases} \quad (27)$$

and a resulting time and frequency response of $$d_3[n] = \frac{S_g}{6R_f}(n-4)(n-3)(n-2) \cdot u[n-4] + \sum_{i=2}^{n-3} e_r[i] \quad (28)$$

$$D_3(z) = \frac{S_g}{R_f} \cdot \frac{(z^{-5} - z^{-P-5})}{(1-z^{-1})^4} + E_r \cdot \frac{z^{-3}}{(1-z^{-1})}.$$

The value of $d_3$ is independent of both truncation error, $t_k$, and the number of feedback bits, k. However, it does depend on the number of ADC bits, r, since this determines the mean-square value of $e_r$. Like the decimator 904 of FIG. 9, this configuration is referred to as an error-averaging decimator because the last term in equation (28) contains an average of $e_r$. This is a general aspect of configurations in which the decimator order is one greater than that of the modulator.

The converter's input sample can be easily reconstructed from $d_3$ because the sequence $S_i$ is known to be constant along the pipeline. Equation (28), evaluated at n=P+4, can be solved directly for $S_g$ in terms of $d_3$ and P, under the assumption that its quantization noise term is negligible. Reconstruction is given by $$S_g \approx d_3[P+4] \cdot \left(\frac{6R_f}{P^3 + 3P^2 + 2P}\right). \quad (29)$$

Equation (29) has a particularly simple implementation if the factor multiplying $d_3$ is chosen as a power of two. In this case the result is identically equal to $d_3$ with a change in significance of its bits. Alternatively, this factor, which only impacts overall converter gain, could be treated as part of the full-scale reference.

Figure 12A:
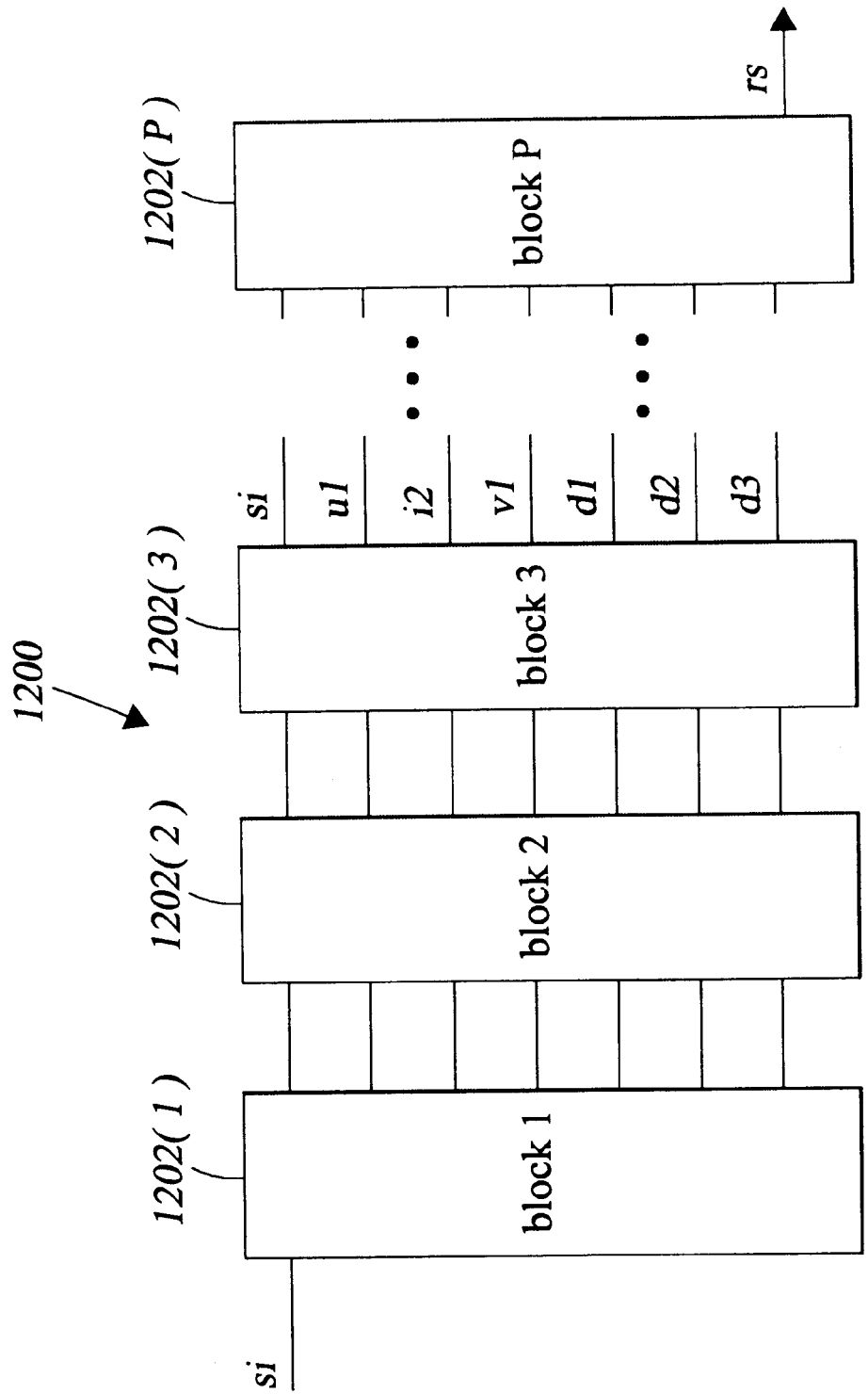
FIGS. 12A and 12B are schematic block diagrams of a pipelined second order POSC which contains P identical conversion blocks and a nth conversion block, respectively.
Figure 12B:
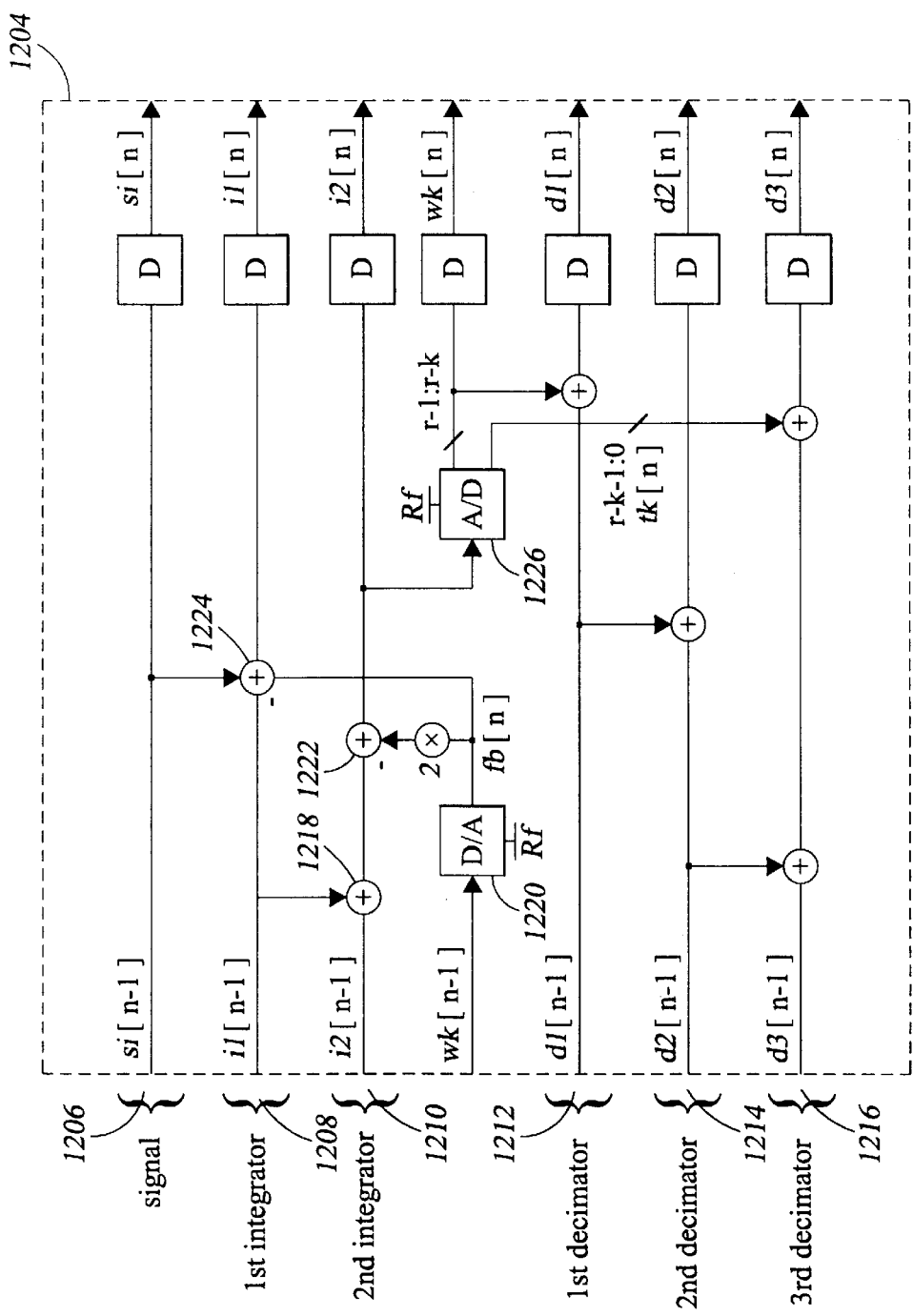

A pipelined implementation of the POSC 1100 of FIG. 11 is shown in FIGS. 12A and 12B. FIG. 12A is a schematic block diagram of a pipelined second order POSC 1200 which contains P identical conversion blocks 1202(1)–1202(P). FIG. 12B is a schematic block diagram of the nth conversion block 1204. Each conversion block includes three analog channels, 1206 ($s_i$), 1208 ($i_1$), and 1210 ($i_2$) that flow through the pipeline. Three digital channels, 1212 ($d_1$), 1214 ($d_2$), and 1216 ($d_3$) that carry decimator signals. Inputs to all integrators and accumulators are zero. The converter's analog input is sampled before the first pipeline stage. The result is passed along the pipeline and used in each stage as part of ΔΣ computations, but it is never altered. The converter's output word is generated by the last stage. Multiple input samples are processed in parallel along the pipeline so that one digital word is completed each clock cycle.

The integrated quantity $i_1$, from the previous stage, is added to integrator 1218. The digital feedback signal $w_k$, is used by a DAC 1220, with a full-scale value of $R_f$, to generate an analog quantity, $f_b$. This value is subtracted twice from $i_2$ with integrator 1222 and once from $i_1$ by integrator 1224. At the same time, the delayed input sample, $s_i$ is added to $i_1$ by integrator 1224. An r-bit ADC 1226 with a full-scale value of $R_f$ quantizes the newly modified value of $i_2$. The k upper bits of the ADC's result form $w_k$, the output from this stage. Decimator signals are updated as shown in the figure. The only digital signal from block n that is needed by block n+1 is $w_k$. The computations for $d_1$, $d_2$, and $d_3$ can be spread across multiple stages since these signals are not needed until the pipeline's end. As shown, $t_k$ is added directly to $d_3$, without delays being present. The final result is not impacted by these delays. Finally, all signals are passed on to the following stage and the process is repeated. The converter's result is generated by normalizing $d_3$ from the last stage using equation (29).

Figure 13A:
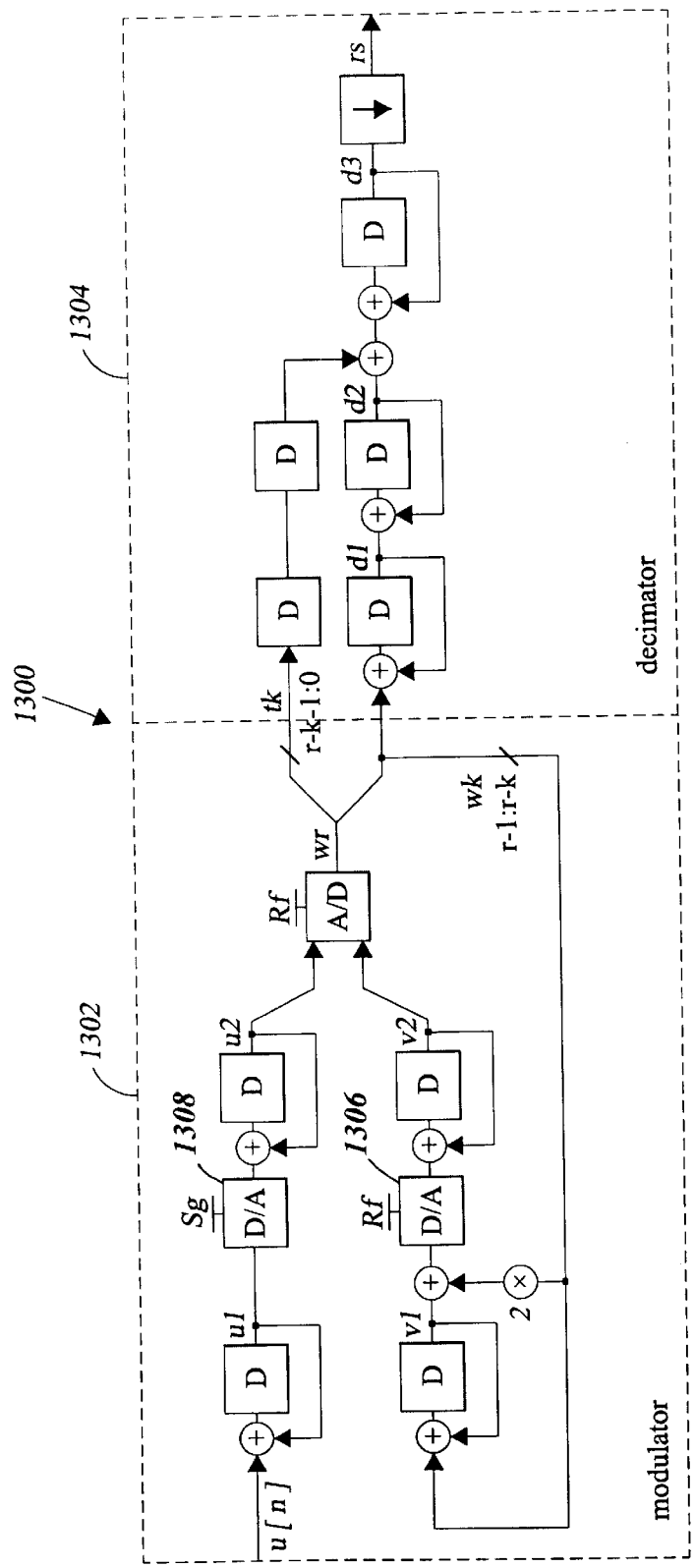
FIGS. 13A–13C illustrate the transition from a second order analog-integration architecture, such as that in FIG. 11, to a second order architecture with a combination of analog and digital integration.
Figure 13B:
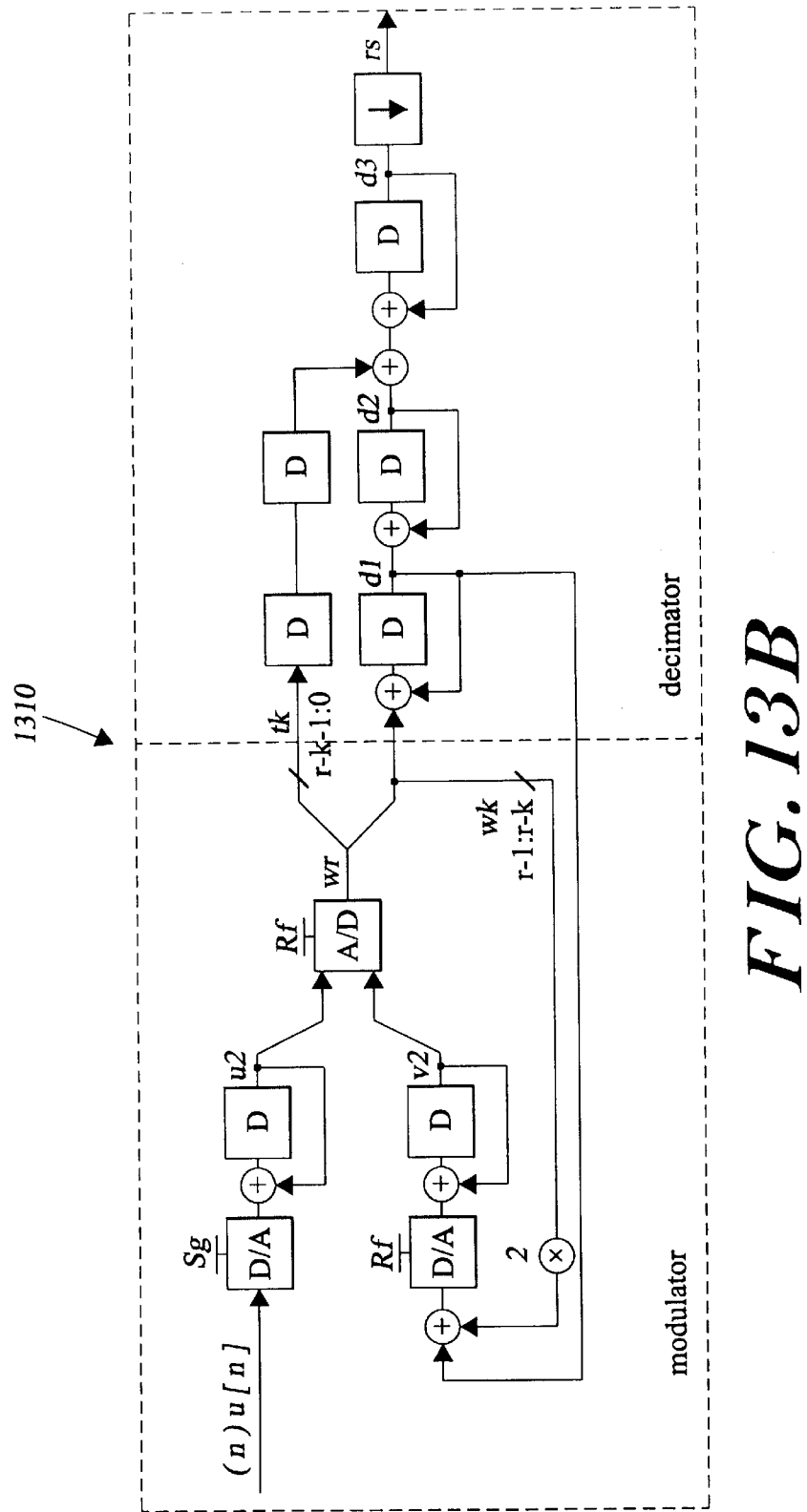
Figure 13C:
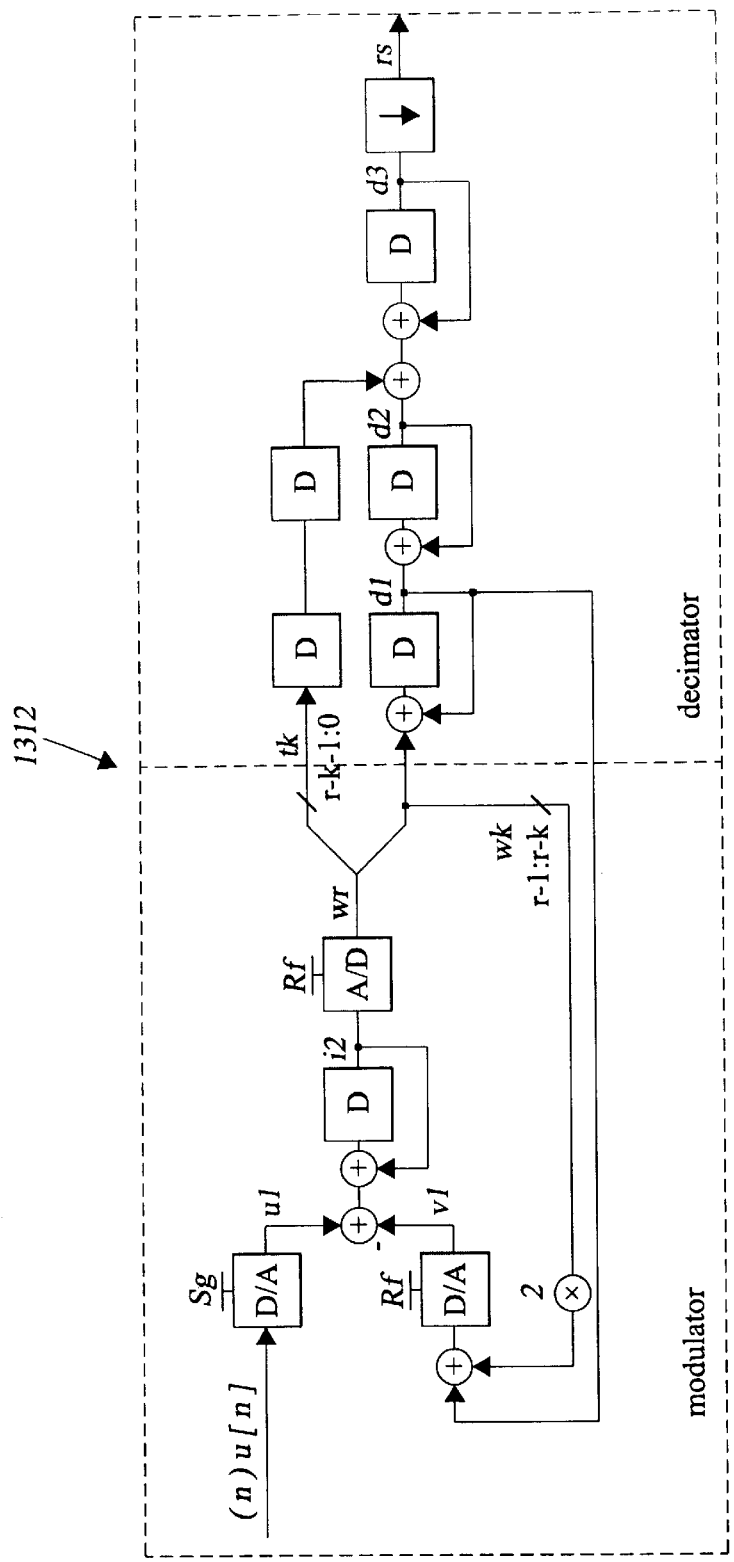

The second order architecture described heretofore includes two stages of cascaded analog integration. Alternatively, one or both of these integration operations may be performed digitally. FIGS. 13A–13C illustrate the transition from a second order analog-integration architecture, such as that in FIG. 11, to a second order architecture with a combination of analog and digital integration. FIG. 13A is a schematic block diagram of a POSC 1300 having a modulator 1302 and a decimator 1304 that differs from the POSC 1100 of FIG. 11 in that the DAC 1306 is repositioned. It was originally located before $v_1$, but now is positioned between $v_1$ and $v_2$. To balance signal and reference paths, a second DAC 1308 is also placed within the upper path, between $u_1$ and $u_2$. In this configuration, $u_1$ and $v_1$ are digital values. Analog quantities $S_g$ and $R_f$ enter the converter through the DAC full-scale references.

The transition from POSC 1300 to POSC 1310 of FIG. 13B is based on the fact that integrators for $u_1$ and $v_1$ are redundant. They can be removed to reduce hardware and power, without altering the $\Delta\Sigma$ algorithm. Node $v_1$ may be replaced by $d_1$ since the values of these two signals are identical. Node $u_1$ may be replaced with the fixed expression $(n)u[n]$, since this signal is a function of pipeline stage, but is independent of the converter's input sample. The schematic block diagram of POSC 1312 of FIG. 13C differs from that in FIG. 13B in that $u_2$ and $v_2$ are combined into a single integrator $i_2$.

Figure 14:
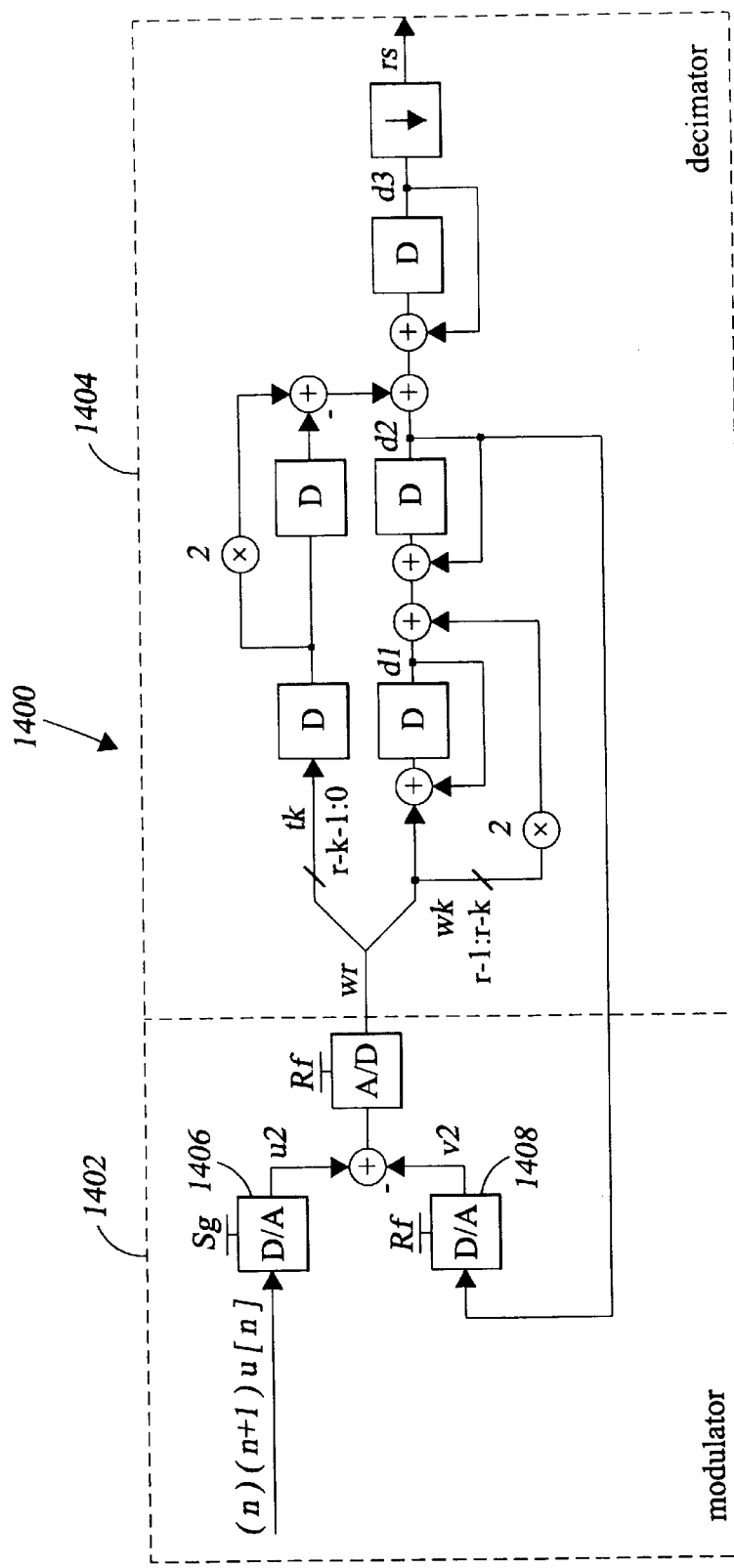
FIG. 14 is a schematic block diagram of a POSC with a configuration which includes two stages of digital integration and no analog integration.

The configuration in FIG. 13C is referred to as a digital-integration architecture. Other varieties of digital-integration architectures are possible as well. For example, FIG. 14 is a schematic block diagram of a POSC 1400 with a modulator 1402 and a decimator 1404. The POSC 1400 has a configuration which includes two stages of digital integration and no analog integration. The only analog operations in this converter are sampling, subtraction, D/A conversion, and coarse A/D conversion.

Digital-integration and analog-integration architectures are algorithmically equivalent. The differences between these approaches lie in their implementations. The upper DAC 1406 has a digital input that is a function of pipeline stage and an analog input equal to the converter's input sample. It generates a signal $$i_2[n] = \begin{cases} 0 \\ i_2[n-1] + u_1[n-1] - v_1[n-1] \end{cases} \quad (30)$$

equal to the product of these inputs. The result is similar to $u_1$ in FIG. 11. The lower DAC 1408 has a digital input that is signal dependent and an analog input that is constant. It generates a signal $$v_1[n] = R \cdot (d_1[n] + 2w_k[n]), \quad (31)$$

whose value is similar to $v_1$ in FIG. 11. It represents the modulator's prediction of the value of $u_1$.

The difference between $u_1$ and $v_1$ is combined in the analog integrator according to $$i_2[n] = \begin{cases} 0 & \text{for } n \leq 1 \\ i_2[n-1] + u_1[n-1] - v_1[n-1] & \text{for } n \geq 2 \end{cases}. \quad (32)$$

The modulator's feedback operates to keep the value in this integrator small so that it may be quantized using only a few bits. An r-bit ADC 1410 with a full-scale value of $R_f$ generates a digital representation of $i_2$. The result, $$w_r[n] = \frac{1}{R_f} \cdot i_2[n] + e_r[n], \quad (33)$$

contains quantization noise, $e_r$. The k most significant bits of this signal form the feedback quantity $$w_k[n] = \frac{1}{R_f} \cdot i_2[n] + e_r[n] - t_k[n]. \quad (34)$$

An expression for the modulator's output is arrived at by iteratively solving equations (30), (31), (32) and (34). The resulting expression, $$w_k[n] = \frac{S_g}{R_f} \cdot u[n-2] + \quad (35)$$
$$(e_r[n] - 2e_r[n-1] + e_r[n-2]) + (t_k[n] - 2t_k[n-1] + t_k[n-2]),$$

is identical to that previously derived for an analog integration architecture in equation (22). Decimator operation is identical to that described for analog integration and is not repeated here.

Figure 15A:
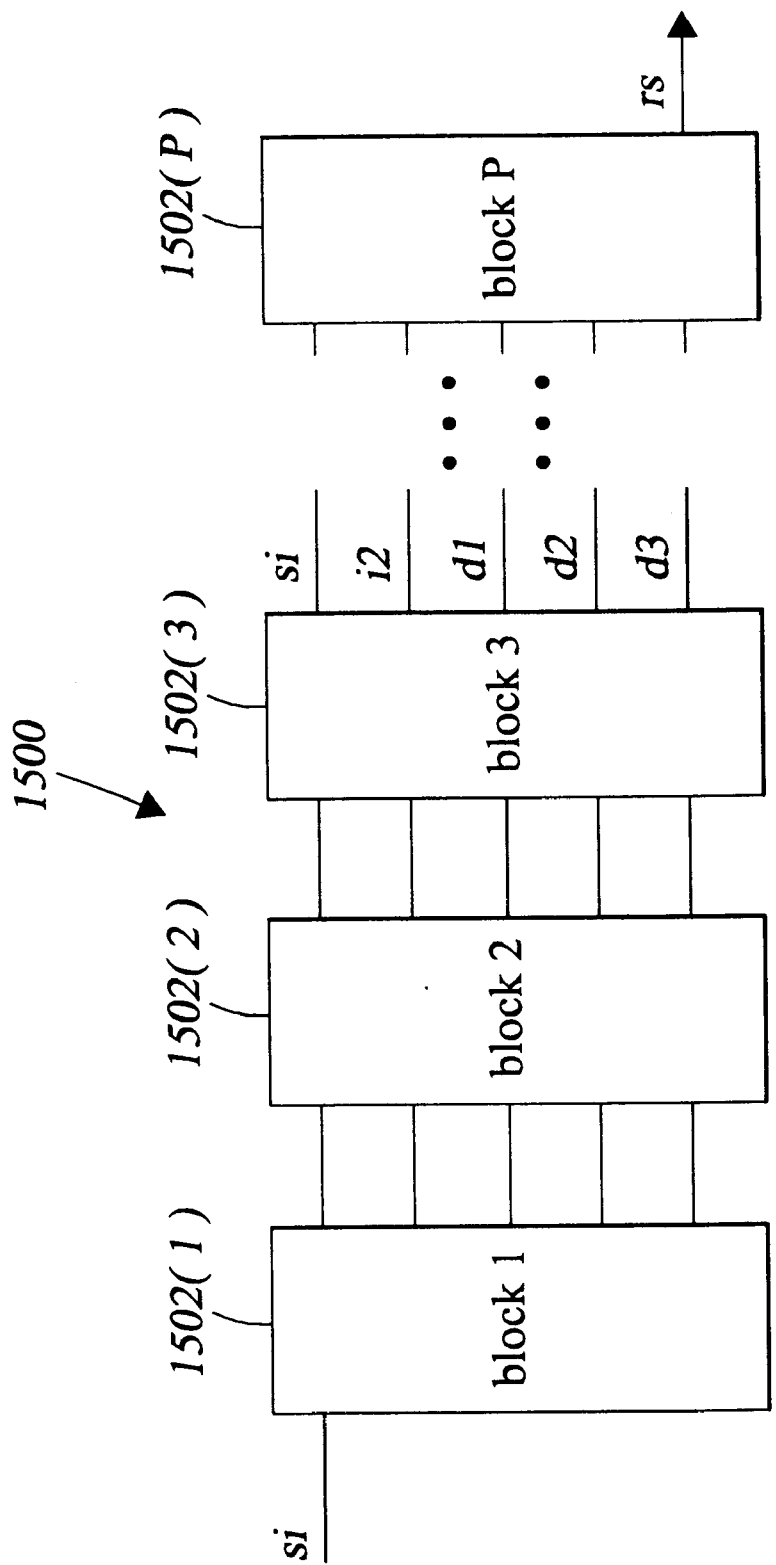
FIGS. 15A and 15B are schematic block diagrams of a second order digital-integration POSC that has a pipeline containing P identical conversion blocks and a $n_{th}$ stage, respectively.
Figure 15B:
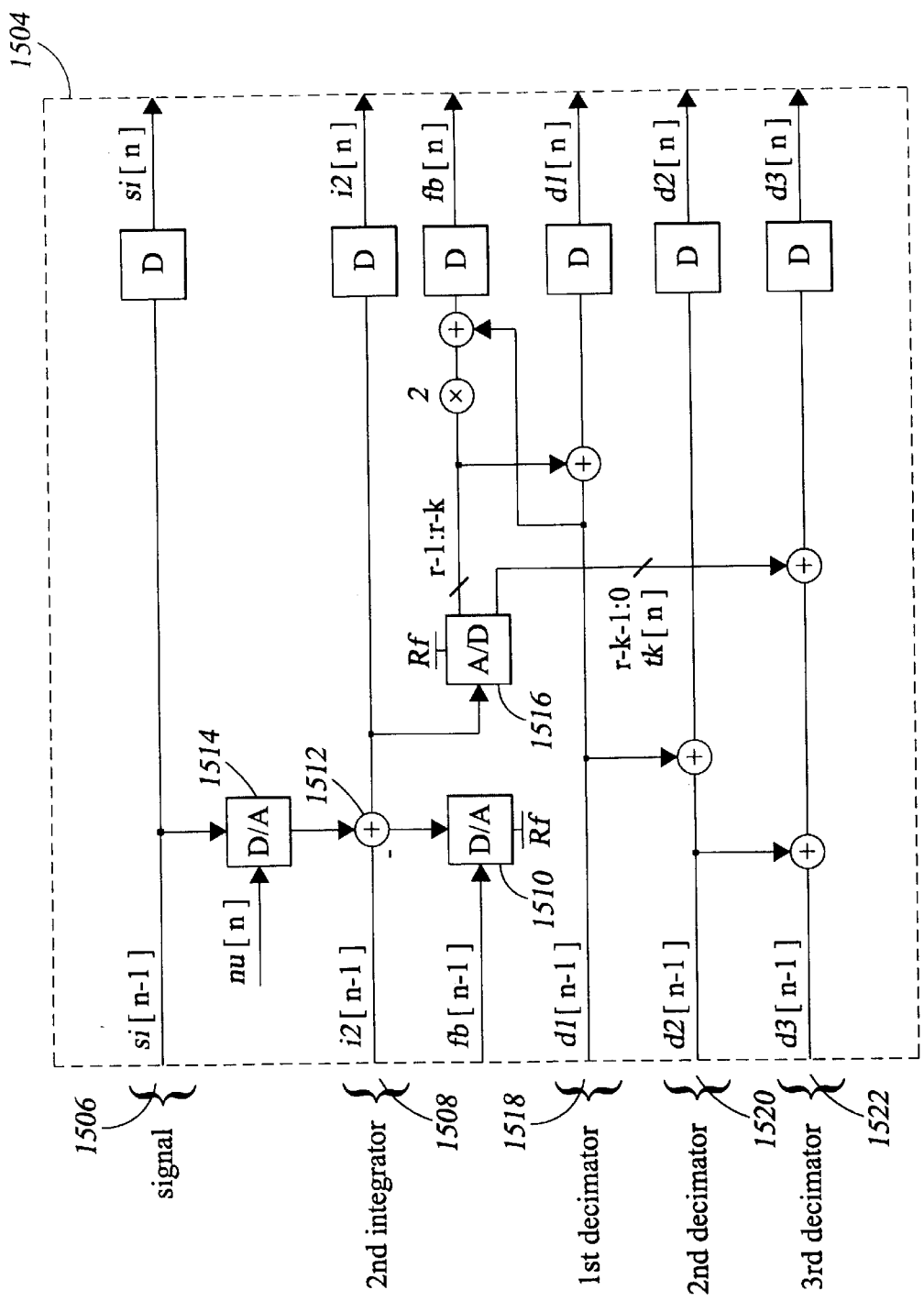

A pipelined implementation of the digital-integration architecture in FIG. 13C is shown in FIGS. 15A and 15B. FIG. 15A is a schematic block diagram of a second order digital-integration POSC 1500 that has a pipeline containing P identical conversion blocks 1502(1)–1502(P). The pipeline in FIG. 15A(a) differs from that of analog integration in that it has only two analog channels, 1506 ($s_i$) and 1508 ($i_2$) that flow through the pipeline, and first 1518, second 1520 and third 1522 decimator channels.

FIG. 15B is a schematic block diagram of the $n_{th}$ stage 1504. An incoming digital feedback signal, $f_b$, is used by a DAC 1510 with a full-scale value of $R_f$ to generate an analog quantity that is subtracted from $i_2$ by integrator. At the same time, the delayed input sample, $s_i$, is provided as a full-scale reference to a DAC 1514 with a digital input of n, and the result is added to $i_2$. An r-bit ADC 1516 with a full-scale value of $R_f$ quantizes the newly modified value of $i_2$. The k upper bits of the ADC's result are combined with the first decimator value $d_1$ to generate the feedback output from this stage. Decimator signals are updated in the same way as those for an analog-integration architecture. Finally, all signals are passed on to the following stage and the process is repeated. The converter's result is generated by normalizing $d_3$ from the last stage using equation (3–52).

Although the present invention has been shown and described with respect to several preferred embodiments thereof, various changes, omissions and additions to the form and detail thereof, may be made therein, without departing from the spirit and scope of the invention.

What is claimed is:

1. An analog-to-digital converter, comprising:
   a first conversion block including inputs for receiving an analog input signal and an analog reference signal;

a plurality of conversion blocks following said first conversion block each comprising:
  means for receiving said analog input signal and said analog reference signal, and at least one analog integrator input and at least one digital decimator input from a previous conversion block,
  a D/A converter having at least one distinct analog output level and an analog input of said analog reference signal, and s digital input of said at least one digital decimator input,
  at least one integrator,
  a quantizer that computes at least one bit as an output,
  means for combining the output of said quantizer with said at least one digital decimator input, and
  means for providing an analog output signal output, at least one analog integrator output, and at least one digital decimator output to a following conversion block; and
  means for generating a result from said at least one digital decimator output at the last of said conversion blocks.

2. An analog-to-digital converter, comprising:
a first conversion block including an input for receiving an analog input signal;
a plurality of conversion blocks following said first conversion block each comprising:
  means for receiving said analog input signal, at least one analog integrator input, and at least one digital decimator input from a previous conversion block,
  a D/A converter having at least one distinct analog output level and an input coupled to at least one bit from said at least one digital decimator input,
  at least one analog integrator, the first of which has an input coupled to said analog input signal and to the output of said D/A converter,
  a quantizer that computes at least one bit as an output and having an input coupled to the output of the last of said at least one integrator,
  means for combining the output of said quantizer with said at least one digital decimator input, and
  means for providing an analog output signal, at least one analog integrator output, and at least one digital decimator output to a following conversion block; and
  means for generating a result from said at least one digital decimator output at the last of said conversation blocks.

3. An analog-to-digital converter, comprising:
a first conversion block including an input for receiving an analog input signal;
a plurality of conversion blocks following said first conversion block each comprising:
  means for receiving said analog input signal, at least one analog integrator input, and at least one digital decimator input from a previous conversion block,
  at least one digital integrator having an input coupled to said at least one digital decimator input,
  a multiplying first D/A converter having at least one distinct analog output level and an analog reference input coupled to said analog input signal,
  a second D/A converter having at least one distinct analog output level and a digital input coupled to said at least one digital decimator input,
  at least one analog integrator, the first of which has inputs coupled to the output of said first D/A converter and the output of said second D/A converter,
  a quantizer that computes at least one bit as an output and having an input coupled to the output of the last of said at least one integrator,
  means for combining the output of said quantizer with said at least one digital decimator input, and
  means for providing an analog output signal, at least one analog integrator output, and at least one digital decimator output to a following conversion block; and
  means for generating a result from said at least one digital decimator output at the last of said conversion blocks.

4. An analog-to-digital converter, comprising:
a first conversion block including an input for receiving an analog input signal;
a plurality of conversion blocks following said first conversion block each comprising:
  means for receiving said analog input signal, at least one analog integrator input, and at least one digital decimator input from a previous conversion block,
  at least one digital integrator having an input coupled to said at least one digital decimator input,
  a multiplying first D/A converter having at least one distinct analog output level and an analog reference input coupled to said analog input signal,
  a second D/A converter having at least one distinct analog output level and a digital input coupled to said at least one digital decimator input,
  a quantizer that computes at least one bit as an output and having an input coupled to the output of said first D/A converter and the output of said second D/A converter,
  means for combining the output of said quantizer with said at least one digital decimator input, and
  means for providing an analog output signal and at least one digital decimator output to a following conversion block; and
  means for generating a result from said at least one digital decimator output at the last of said conversion blocks.

* * * * *